US012810928B2

(12) United States Patent
Tanaka et al.

(10) Patent No.: US 12,810,928 B2
(45) Date of Patent: Nov. 24, 2026

(54) TECHNIQUES FOR CREATING BETWEEN MARGIN DELAY IN MEMORY DEVICES

(71) Applicant: Taiwan Semiconductor Manufacturing Company, Ltd., Hsinchu (TW)

(72) Inventors: Tomotaka Tanaka, Hsinchu City (TW); Yumito Aoyagi, Hsinchu City (TW); Makoto Yabuuchi, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 150 days.

(21) Appl. No.: 18/824,183

(22) Filed: Sep. 4, 2024

(65) Prior Publication Data

US 2026/0065980 A1 Mar. 5, 2026

(51) Int. Cl.

| | |
|---|---|
| ***G11C 11/419*** | (2006.01) |
| ***G11C 7/22*** | (2006.01) |
| ***G11C 11/412*** | (2006.01) |
| ***H03K 3/037*** | (2006.01) |

(52) U.S. Cl.

CPC ............ *G11C 11/419* (2013.01); *G11C 7/222* (2013.01); *G11C 11/412* (2013.01); *H03K 3/0377* (2013.01)

(58) Field of Classification Search

CPC ..... G11C 11/419; G11C 7/222; G11C 11/412; G11C 7/12; G11C 7/227; G11C 11/418; H03K 3/0377

See application file for complete search history.

(56) References Cited

U.S. PATENT DOCUMENTS

| | | | | |
|---|---|---|---|---|
| 4,627,032 A * | 12/1986 | Kolwicz | G11C 11/419 | 365/210.1 |
| 6,643,204 B1 * | 11/2003 | Agrawal | G11C 8/18 | 365/210.1 |
| 7,746,716 B2 * | 6/2010 | Jetton | G11C 7/22 | 365/207 |
| 8,315,085 B1 * | 11/2012 | Chang | G11C 29/50012 | 365/194 |
| 8,773,927 B2 * | 7/2014 | Evans | G11C 29/02 | 365/194 |
| 9,111,606 B2 * | 8/2015 | Wang | G11C 11/419 | |
| 9,406,351 B2 * | 8/2016 | Stansfield | G11C 11/419 | |

FOREIGN PATENT DOCUMENTS

| | | |
|---|---|---|
| JP | H06-139787 A | 5/1994 |
| TW | 202410041 A | 3/2024 |

OTHER PUBLICATIONS

Office Action issued in Taiwan Appl. No. 114105633 dated Dec. 16, 2025.

* cited by examiner

*Primary Examiner* — Uyen Smet
*Assistant Examiner* — Christopher Lane Reece
(74) *Attorney, Agent, or Firm* — Foley & Lardner LLP

(57) ABSTRACT

Memory devices, circuits, and a method of operating the same are disclosed. In one aspect, a memory system includes a memory array comprising a bit line. The memory system includes a tracking memory cell array coupled to a tracking bit line that mimics an electrical characteristic of the bit line of the memory array. The memory system includes a tracking pre-charge circuit configured to pre-charge the tracking bit line according to a charge time of the bit line to create sufficient between margin for memory operations of the memory array.

20 Claims, 14 Drawing Sheets

TECHNIQUES FOR CREATING BETWEEN MARGIN DELAY IN MEMORY DEVICES

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
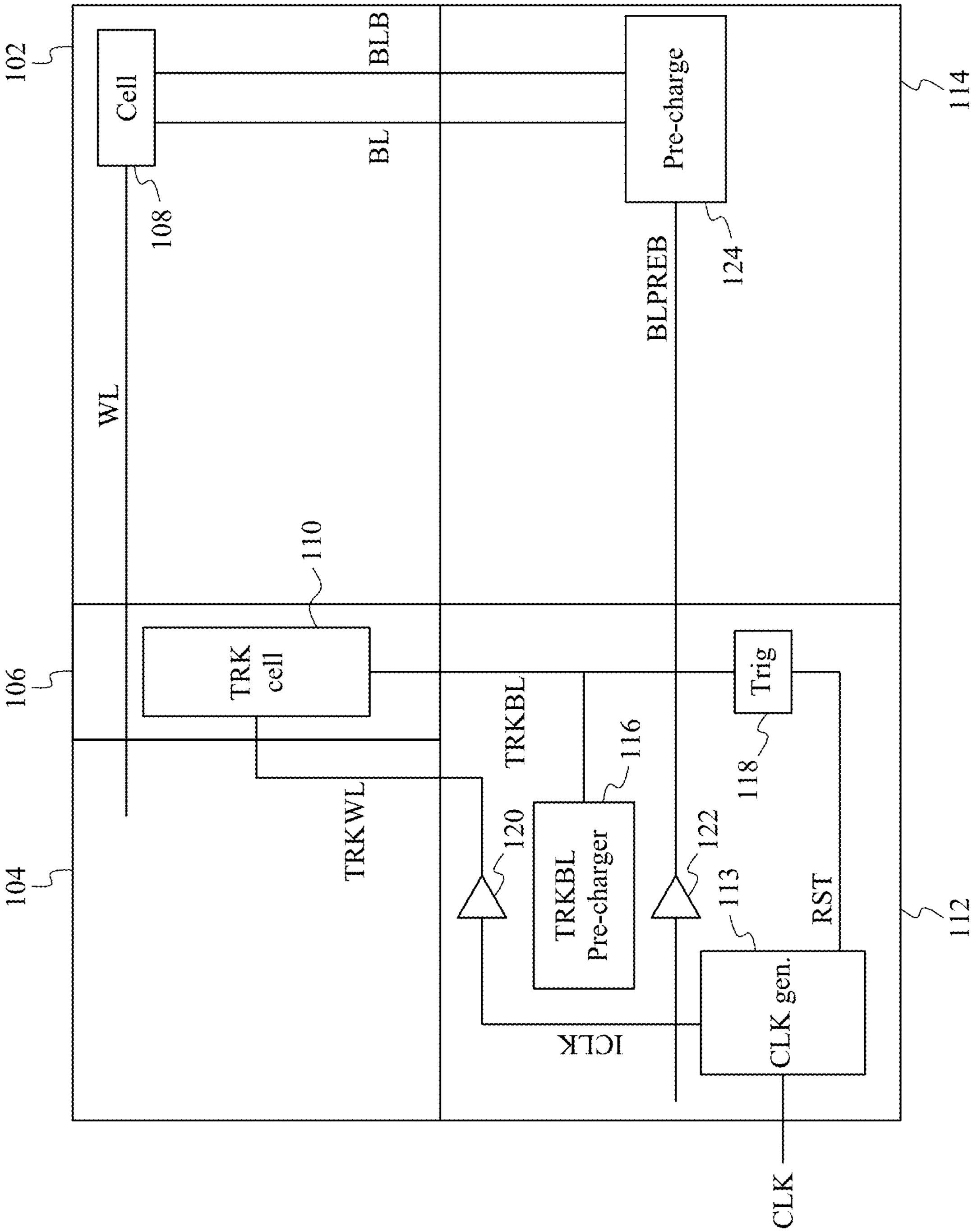
FIG. 1 illustrates a diagram of an example memory system including delay circuits to create sufficient between margin, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” “top,” “bottom” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Memory circuits, include static random-access memory (SRAM) circuits, often includes arrays of memory cells that are selectively controlled to perform read and write operations. Such operations are synchronous, and one challenge to designing memory devices includes ensuring that circuit elements are activated with correct timing to avoid unnecessary delays and power consumption. In pseudo-multiport memory, SRAM memory cells use the same physical port for both read and write operations. Before accessing a memory cell, the bit line coupled to that memory cell needs to be charged or discharged to its desired state. When performing consecutive memory operations in a memory array, a delay time referred to herein as “between margin” is implemented to ensure that the bit lines of the memory array are sufficiently charged or discharged for the next memory operation.

Conventional approaches for implementing delays to ensure sufficient between margin involve the use of inverter chains. Inverter chains include of multiple inverters connected in series, creating signal path delay that is proportional to the number of inverters in the chain and their individual propagation delays. However, traditional inverter chains cannot produce consistent delay for sufficient between margin when according for changes in process, voltage, and temperate (PVT) changes that may occur during device creation or during device operation.

The present disclosure provides various techniques for implementing memory systems that include delay circuits that create delays for sufficient between margin even when experiencing PVT variations. Rather than merely implementing traditional inverter chain delay circuits, the systems, circuits, and methods described herein provide delay circuits that implement the structure of memory circuits in parallel tracking circuits, which operate to create delay for sufficient between margin according to changes in PVT. As the tracking circuits and corresponding input/output lines mimic the electrical characteristics of the actual memory cells, the delays created according to the techniques described herein always provide sufficient between margin, enabling designs with tighter timing tolerances and higher throughput while reducing overall device area.

FIG. 1 illustrates a diagram of an example memory system 100 including delay circuits to create sufficient between margin, in accordance with some embodiments. The memory system 100 can be included in any type of memory device or integrated circuit (IC) device. In at least one embodiment, a memory device is an individual IC device. In some embodiments, a memory device is included as a part of a larger IC device which comprises circuitry other than the memory device for other functionalities.

Each of the components shown in the memory system 100 may receive power from one or more voltage sources. The memory system 100 may include one or more logic gates and sub-circuits, each of which may be constructed from one or more logic gates. Logic gates are electronic devices that perform logical operations on one or more input signals to produce a single output signal. Various embodiments of the circuits and logic gates that implement the memory system 100 may include various transistors. The transistors described herein may have a certain type (n-type or p-type), but embodiments are not limited thereto. The transistors can be any suitable type of transistor including, but not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like.

It should be understood that although the memory system 100 shown in FIG. 1 can be a portion of a larger memory circuit, including any number of pairs of bit lines BL and BLB or write lines WL, which may be addressed by corresponding memory cell selection circuitry. Likewise, although not shown here for visual clarity, various additional circuitry may be included to address (e.g., select) various portions of the memory cells or to perform different memory operations, such write operations or read operations, among others.

The memory system 100 is shown as including a memory cell array 102 including a memory cell 108 coupled between a pair of bit lines BL and BLB. The memory cell 108 can be any type of memory device capable of storing at least one bit of memory data, including but not limited to an SRAM cell or a dynamic random-access memory (DRAM) cell, among others. The bit lines BL and BLB, and the memory cell 108 coupled therebetween, can be included as a portion of a column of a memory array, in some implementations. As shown, a pre-charge circuit 124 is coupled to the bit lines BL and BLB. The pre-charge circuit 124 can include any type of circuitry to charge the bit lines BL and BLB to a predetermined voltage (e.g., about the supply voltage) for write operations. Although not shown here for visual clarity, in some implementations, multiple memory cells 108 may be arranged in multiple rows and coupled to each of the pair of bit lines BL and BLB. The memory array can include multiple columns, which each column including a corresponding set of bit lines having multiple memory cells 108 coupled thereto.

Individual memory cells 108 of the memory array can be addressed by accessing corresponding bit lines BL and BLB (to select by column) and/or corresponding word lines WL or source lines (to select by row). Addressed memory cells can be selected for write and/or read operations. Signals that select memory cells and coordinate read/write operations can be provided by a memory control circuit. The memory control circuit may include any type of control circuit that provides signals to coordinate read or write operations via the circuitry of the memory system 100. In some implementations, one or more components of the memory system 100 may form at least a part of a memory control circuit.

Figure 3:
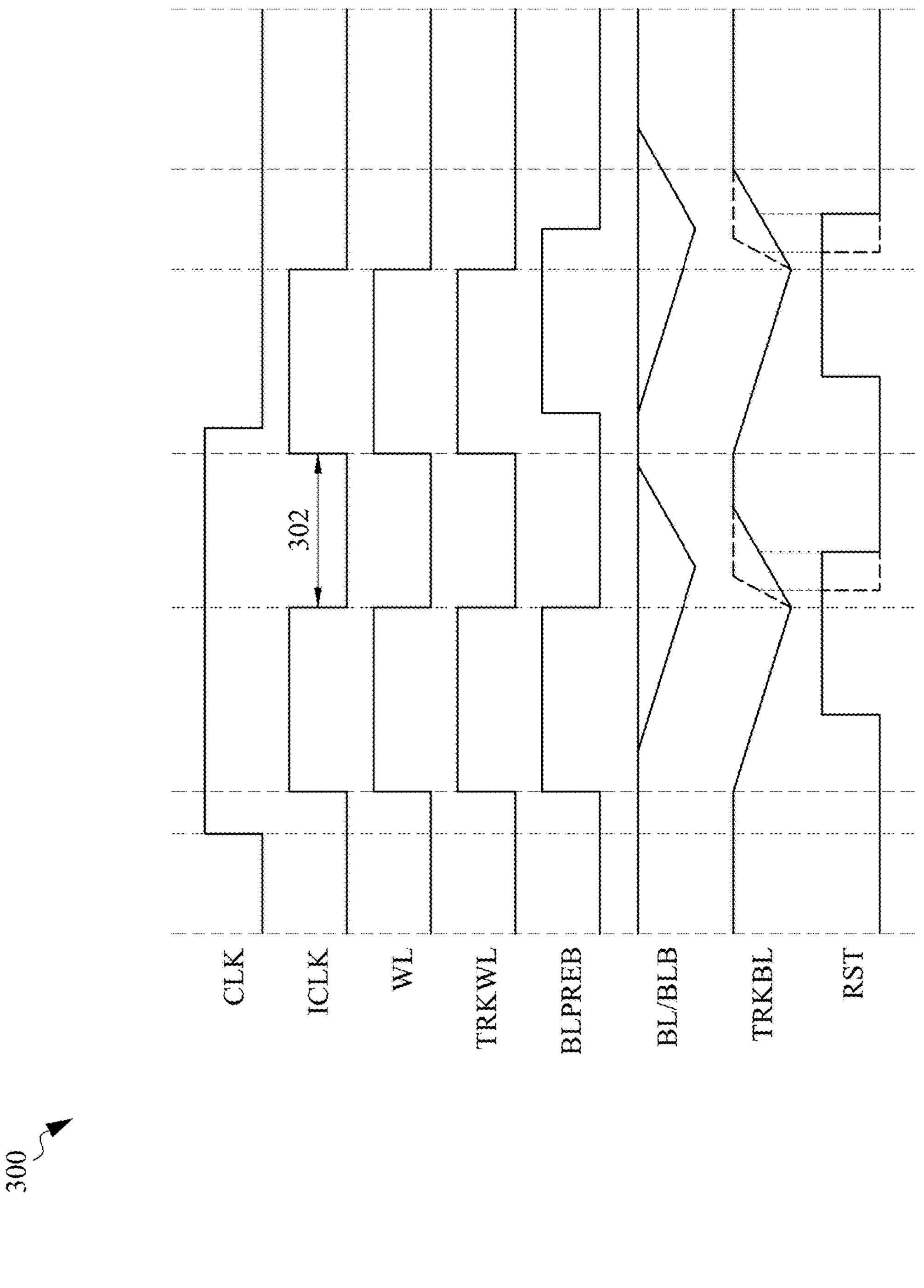
FIG. 3 illustrates a diagram showing example waveforms of signals that can propagate through the memory circuit shown in FIG. 2 during memory operations, in accordance with some embodiments.

The memory system 100 is shown as including a control circuit 112, which includes a clock generator circuit 113. The clock generator circuit 113 is shown as receiving a clock (CLK) signal. The CLK signal is a timing signal that controls the timing of operations in the memory system 100. The clock generator circuit 113 can generate an internal clock (ICLK) signal, which can be a timing signal used to coordinate read/write operations to one or more memory cells 108. The clock generator circuit 113 can include any type of circuitry to generate an ICLK signal as a function of the input clock signal CLK. An example waveform of the ICLK signal relative to the input clock signal CLK is shown in FIG. 3.

Figure 2:
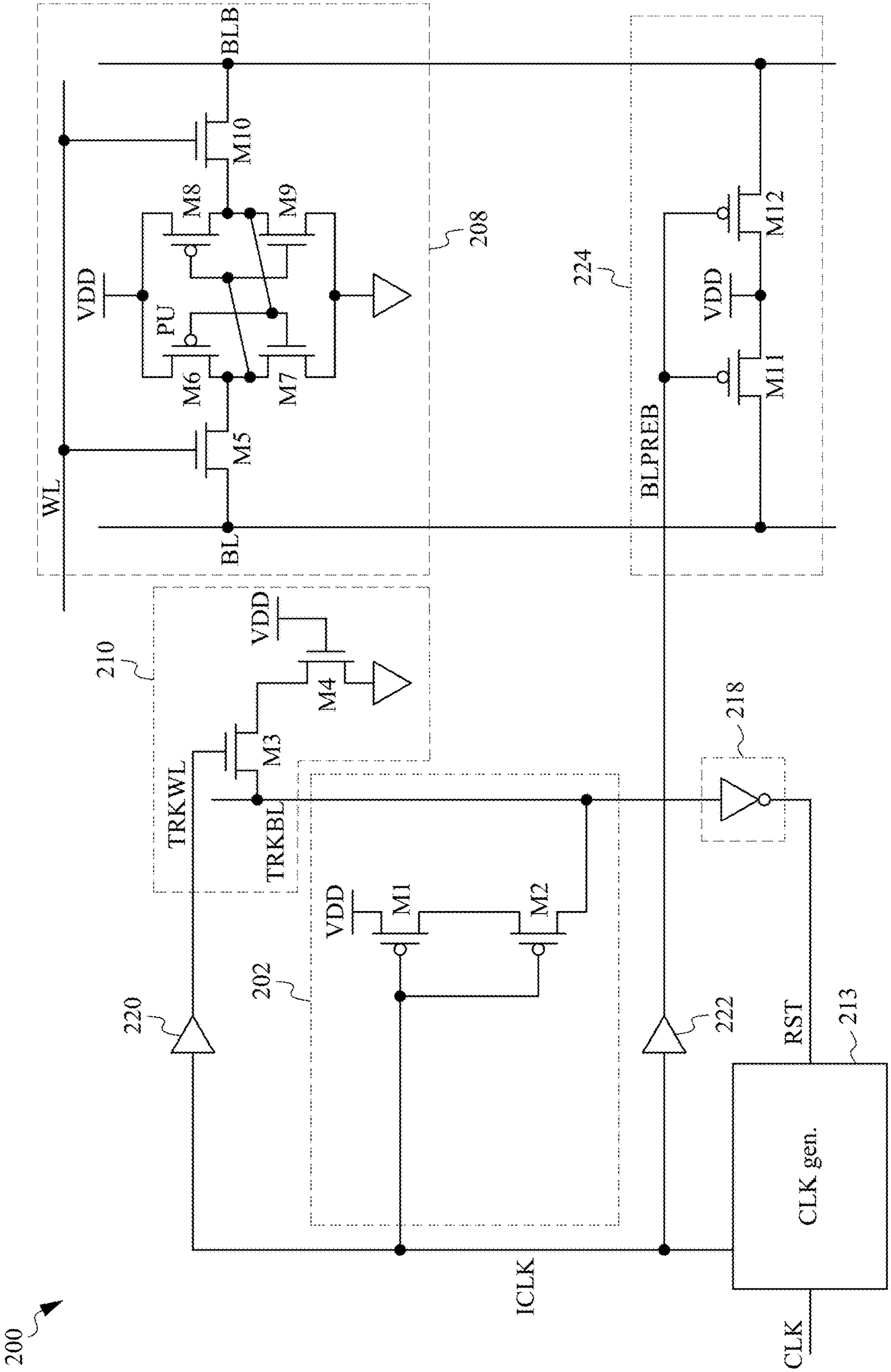
FIG. 2 illustrates an example circuit diagram implementing the memory system of FIG. 1, in accordance with some embodiments.

The memory system 100 is shown as including a word line driver circuit 104, which when activated can generate an activation signal on the WL coupled to the memory cell 108 to select the memory cell 108 for a memory operation. The memory system 100 is shown as including a tracking memory cell array 106, which can include at least one tracking memory cell 110. An example circuit including an example structure of the tracking memory cell 110 is shown in FIG. 2. The tracking memory cell 110 can mimic the electrical characteristics of the memory cell 108 with respect to WL activation and bit line pre-charging/discharging. The memory system 100 is shown as including an input/output (I/O) circuit 114, which includes the pre-charging circuit 124 coupled to the bit lines BL and BLB.

The ICLK signal generated by the clock generator circuit 113 is provided as input to the buffers 120 and 122. The buffers 120 and 122 may include any even number of inverters to buffer the ICLK signal, to preserve signal strength during transmission to other circuits in the memory system 100 or to introduce a small amount of delay. The buffer 120 provides a buffered ICLK signal as input to the tracking memory cell 110 as the tracking word line (TRKWL) signal, which mimics the assertion of the word line WL by the word line driver circuit 104. As shown, the tracking (TRK) memory cell 110 is coupled to the tracking bit line (TRKBL), which mimics the electrical characteristics of the bit line BL.

The control circuit 112 is shown as including the TRK pre-charging circuit 116, which can receive the ICLK signal and control the voltage level of the TRKBL node coupled to the TRK memory cell 110. Further details of the TRK pre-charging circuit 116 are described in connection with FIG. 2. The TRKBL node is coupled to the reset trigger circuit 118, which controls the reset signal RST for the clock generator circuit 113. Waveforms corresponding to the signals shown in the memory system 100 are described in further detail in connection with FIG. 3.

Referring to FIG. 2, illustrated is an example memory circuit 200 implementing at least a portion of the memory system 100 of FIG. 1, in accordance with some embodiments. The memory circuit 200 may implement similar functionality and may include similar structure to the memory system 100 shown in FIG. 1. Each of the components shown in the memory circuit 200 may receive power from one or more voltage sources such as the supply voltage VDD. The memory circuit 200 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 200 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like. It should be understood that the memory circuit 200 shown in FIG. 2 can be a portion of a larger memory circuit that includes memory cells (e.g., memory cells 108) and corresponding read/write circuitry. For example, although not shown here for visual clarity, various additional circuitry may be included to address (e.g., select) or otherwise access memory cells or to perform different memory operations, including but not limited to CIM operations, write operations, or read operations, among others.

The memory circuit 200 is shown as including the transistors M1, M2, M3, M4, M5, M6, M7, M8, M9, M10, M11, and M11. Transistors M1 and M2 are shown as part of the TRK pre-charging circuit 202. Transistors M3 and m4 are shown as part of the TRK memory cell 210. Transistors M5, M6, M7, M8, M9, and M10 are shown as part of the memory cell 208. The transistors M11 and M12 are shown as part of the pre-charging circuit 224. The TRK pre-charging circuit 202, the clock generator circuit 213, the TRK memory cell 210, the pre-charging circuit 224, and the memory cell 208 can be similar to and include any of the structure and implement any of the functionality of the TRK pre-charging circuit 116, the clock generator circuit 113, the TRK memory cell 110, the pre-charging circuit 124, and the memory cell 108, respectively, of the memory system 100 described in connection with FIG. 1.

Although each of the transistors M1-M12 of the memory circuit 200 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel. For example, each of the devices M1 and M2 may each include four transistors in parallel, and each of the transistors M11 and M12 can each include two transistors in parallel, in some implementations.

The TRK pre-charging circuit 202 includes transistors M1 and M2. In some implementations, the transistors M1 and M2 are pMOSFET transistors. It is appreciated that each of the transistors M1 and M2 can include any of various other types of transistors (e.g., bipolar junction transistors, high-electron-mobility transistors, etc.) while remaining within the scope of the present disclosure. As shown, the sources of the transistor M1 is coupled to the supply voltage VDD and the source of the transistor M2 is coupled to the drain terminal of the transistor M1. The drain terminal of the transistor M2 is coupled to the TRKBL node. The gate terminals of the transistors each receive the ICLK signal generated by the clock generator circuit 213.

As shown, the memory circuit 200 includes the buffers 220 and 222, which may be similar to and include any of the structure of the buffers 120 and 122 of the memory system 100 described in connection with FIG. 1. The TRK memory cell 110 is shown as including the transistors M3 and M4. In some implementations, the transistors M3 and M4 are nMOSFET transistors. It is appreciated that each of the transistors M3 and M4 can include any of various other types of transistors (e.g., bipolar junction transistors, high-electron-mobility transistors, etc.) while remaining within the scope of the present disclosure. A first source/drain terminal of the transistor M3 is coupled to the TRKBL node and a second source/drain terminal of the transistor M3 is coupled to a first source/drain terminal of the transistor M4. The gate terminal of the transistor M4 is coupled to the supply voltage VDD and a second source/drain terminal of the transistor M4 is coupled to a ground voltage.

The buffer 222 provides a buffered ICLK signal, shown here as the active-low bit line pre-charge signal (BLPREB) to the gate terminals of the transistors M11 and M12. The pre-charging circuit 224 is shown as including the transistors M11 and M12. In some implementations, the transistors M11 and M12 are pMOSFET transistors. It is appreciated that each of the transistors M11 and M12 can include any of various other types of transistors (e.g., bipolar junction transistors, high-electron-mobility transistors, etc.) while remaining within the scope of the present disclosure. A first source/drain terminal of the transistor M11 is coupled to the bit line BL and a second source/drain terminal of the transistor M11 is coupled to the supply voltage VDD. A first source/drain terminal of the transistor M12 is coupled to the supply voltage VDD and a second source/drain terminal of the transistor M12 is coupled to the second bit line BLB.

The memory cell 208 can be an SRAM memory cell. The memory cell 208 is shown as including the transistors M5, M6, M7, M8, M9, and M10. In some implementations, the transistors M5, M7, M9, and M10 are nMOSFET transistors. In some implementations, the transistors M6 and M8 are pMOSFET transistors. It is appreciated that each of the transistors M5, M6, M7, M8, M9, and M10 can include any of various other types of transistors (e.g., bipolar junction transistors, high-electron-mobility transistors, etc.) while remaining within the scope of the present disclosure. The transistors M6, M7, M8, and M9 are shown in a cross-coupled arrangement. The sources of the transistors M6 and M8 are coupled to the supply voltage VDD and the sources of the transistors M7 and M9 are coupled to the ground voltage.

The gates of the transistors M6 and M7 are coupled to one another and to the drain terminals of the transistors M8 and M9, which are coupled to one another. The gates of the transistors M8 and M9 are coupled to one another and to the drain terminals of the transistors M6 and M7, which are coupled to one another. A first source/drain terminal of the transistor M5 is coupled to the bit line BL and a second source/drain terminal of the transistor M5 is coupled to the drain terminals of the transistors M6 and M7. A first source/drain terminal of the transistor M10 is coupled to the bit line BLB and a second source/drain terminal of the transistor M10 is coupled to the drain terminals of the transistors M8 and M9.

When the clock generator circuit 213 receives a rising edge of the clock signal CLK, the clock generator circuit 213 generates an active high ICLK signal (e.g., logic high, about the supply voltage, etc.). This causes the transistors M11 and M12 to turn off (e.g., BLPREB behaves as an active-low signal), deactivating the pre-charging circuit 224. This also causes the transistors M1 and M2 to be deactivated, while TRKWL is asserted, causing the TRKBL node to discharge via the transistors M3 and M4. The TRKWL in the logic high state (e.g., about the supply voltage) causes the transistor M3 to turn on and conduct, while the transistor M4 is always turned on and conducting. This mimics the discharge behavior of the bit lines BL and BLB. Although only one TRK memory cell 210 is shown here, it should be understood that in some implementations, multiple TRK memory cell 210 may be coupled to the TRKBL (and not coupled to the TRKWL, to simulate unselected transistors) to mimic the electrical characteristics of the bit line BL.

As the TRKBL node discharges to about half the supply voltage, the trigger circuit 218 (which may be similar to the trigger circuit 118 of FIG. 1) generates a logic high RST signal. In this example, the trigger circuit 218 is an inverter, which produces output in a logic high state once the input (e.g., the voltage at the TRKBL node) reaches a threshold activation value for the inverter. The threshold activation value may be any value that the inverter detects as a logic zero or logic low signal, which may be about half the supply voltage VDD. The reset signal RST causes the clock generator circuit 213 to set the ICLK signal to a logic low state.

When the ICLK signal is in the logic low stage, the transistors M1 and M2 of the TRK pre-charging circuit 202 turn on and conduct, while the transistor M3 is turned off and does not conduct, thereby charging the TRKBL node to about the supply voltage. The transistors M11 and M12 of the pre-charging circuit turn on and conduct, pre-charging the bit lines BL and BLB. In some implementations, using a stacked configuration of pMOSFET transistors M1 and M2 slows down the pre-charging of the TRKBL node, ensuring sufficient between margin timing. Once the TRKBL node transitions to a logic high state, the trigger circuit 218 outputs the reset signal RST in a logic low state, causing the clock generator circuit 213 to generate the ICLK signal in the logic high state for the next memory operation. Example waveforms corresponding to these memory operations are described in connection with FIG. 3.

Referring to FIG. 3 in the context of the components described in connection with FIG. 2, illustrated is a diagram 300 showing example waveforms of signals that can propagate through the memory circuit shown in FIG. 2 during memory operations, in accordance with some embodiments. The diagram 300 shows two read operations, one performed at a first port, and another performed at a second port of an example memory array (e.g., the memory array 102 of FIG. 1). As shown, the memory operations are initiated at the rising edge of the input clock signal CLK. A corresponding rising edge is generated on the ICLK signal (e.g., by the clock generator circuit 213) with a slight delay due to the internal logic of the clock generator circuit.

As described in connection with FIG. 2, this causes the word line WL, the tracking word line TRKWL, and the pre-charge signal BLPREB to transition to a logic high state, selecting the memory cell 208, the TRK memory cell 210, and deactivating the pre-charging circuit 224 and the TRK pre-charging circuit 202. When the pre-charging circuit 224 and the TRK pre-charging circuit 202 are deactivated, the voltage at the tracking bit line TRKBL and the bit line BL begin to decrease over time. When the tracking bit line TRKBL reaches a threshold voltage, a trigger circuit (e.g., the trigger circuit 218) causes the reset signal RST to transition to a logic high state (e.g., about the supply voltage). As the electrical characteristic of the tracking bit line TRKBL match that of the bit line BL, the voltage discharge at the tracking bit line TRKBL mimics that of the bit line BL, as shown.

When the reset signal RST is asserted in the logic high state, the clock generator circuit 213 causes the ICLK signal to transition to the logic low state, after a suitable amount of delay (which may be implemented via the logic of the clock generator circuit 213). When the ICLK signal transitions to the logic low state, the word line WL, the tracking word line TRKWL, and the pre-charge signal BLPREB each transition to the logic low state. This causes the pre-charging circuit 224 and the TRK pre-charging circuit 202 to become activated, causing the voltage at the TRKBL node and the bit line BL to rise, as shown. When the TRKBL node rises to a threshold voltage, the trigger circuit (e.g., the trigger circuit 218) causes the reset signal RST to transition to a logic low state.

When the reset signal RST is asserted in the logic low state, the clock generator circuit 213 causes the ICLK signal to transition to the logic high state, after a suitable amount of delay (which may be implemented via the logic of the clock generator circuit 213). This initializes a subsequent memory operation during the same clock period as the input clock signal (e.g., on a second memory port of the memory array). As shown, a similar operation to that described above is performed in response to the assertion of the ICLK signal in the logic high state.

As the delay created by the voltage at the TRKBL is a function of the device characteristics, the delay creates a suitable between margin 302 between memory operations (e.g., between assertion of the ICLK signal in the logic high state), enabling higher throughput compared to other approaches. When PVT characteristics of the memory device change (e.g., increased temperature, etc.), the delay adjusts accordingly, as shown by the dashed line waveforms shown for the TRKBL node and the reset signal RST. In this example, if the electric characteristics cause the TRKBL to charge faster, the reset signal is asserted in the logic high and low state to compensate for these changes, a shown. Although the foregoing is shown as a read/read operation, it should be understood that the memory operations may be any suitable sequence of memory operations, including write/read operations, read/write operations, or write/write operations.

Figure 4:
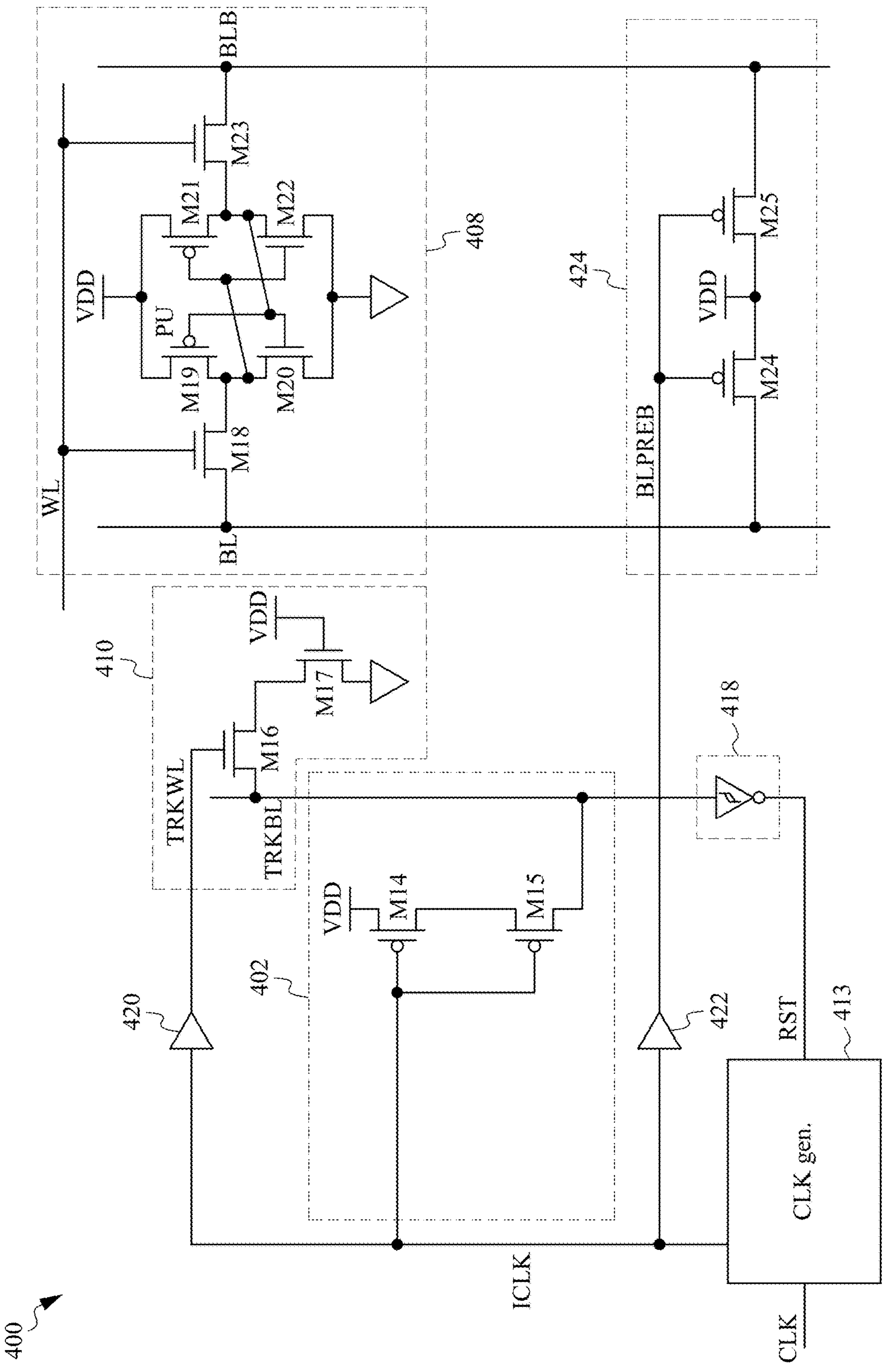
FIG. 4 illustrates a diagram of another example memory circuit including delay circuits to create sufficient between margin using a Schmitt trigger, in accordance with some embodiments.

Referring to FIG. 4, illustrated is a diagram of another example memory circuit 400 including delay circuits to create sufficient between margin using a Schmitt trigger, in accordance with some embodiments. The memory circuit 400 may implement similar functionality and may include similar structure to the memory circuit 200 shown in FIG. 2 and may be implemented as part of the memory system 100 of FIG. 1. Each of the components shown in the memory circuit 400 may receive power from one or more voltage sources such as the supply voltage VDD. The memory circuit 400 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 400 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like. It should be understood that the memory circuit 400 shown in FIG. 4 can be a portion of a larger memory circuit that includes memory cells (e.g., memory cells 108) and corresponding read/write circuitry. For example, although not shown here for visual clarity, various additional circuitry may be included to address (e.g., select) or otherwise access memory cells or to perform different memory operations, including but not limited to CIM operations, write operations, or read operations, among others.

The memory circuit 400 is shown as including the transistors M14, M15, M16, M17, M18, M19, M20, M21, M22, M140, M141, and M141. Transistors M14 and M15 are shown as part of the TRK pre-charging circuit 402. Transistors M16 and M17 are shown as part of the TRK memory cell 410. Transistors M18, M19, M20, M21, M22, and M140 are shown as part of the memory cell 408. The transistors M141 and M142 are shown as part of the pre-charging circuit 424. The TRK pre-charging circuit 402, the clock generator circuit 413, the TRK memory cell 410, the pre-charging circuit 424, and the memory cell 408 can be similar to and include any of the structure and implement any of the functionality of the TRK pre-charging circuit 202, the clock generator circuit 213, the TRK memory cell 210, the pre-charging circuit 224, and the memory cell 208, respectively, of the memory circuit 200 described in connection with FIG. 2.

Although each of the transistors M14-M25 of the memory circuit 400 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel. For example, each of the devices M14 and M15 may each include four transistors in parallel, and each of the transistors M24 and M25 can each include two transistors in parallel, in some implementations. Each of the source, drain, and gate terminals of the transistors M14-M25 can be connected in a similar manner to the source, drain, and gate terminals of the transistors M1-M12 described in connection with FIG. 2.

The memory circuit 400 can operate in a similar manner to the memory circuit 200 of FIG. 2. As shown, the memory circuit 400 includes the trigger circuit 418, which in this example is a Schmitt trigger. A Schmitt trigger is an electronic circuit that converts a slowly changing input signal into a sharply defined output signal having a logic high state or a logic low state. The Schmitt trigger can include an amplifier stage with two thresholds (or hysteresis points). One hysteresis point can be a threshold for switching to a logic high output state and a second threshold can define when the output switches back to a logic low output state. As described herein, the reset signal RST is used to control the state of the ICLK signal via the clock generator circuit 413. The use of a Schmitt trigger as part of the trigger circuit 418 enables a threshold different than about half of the supply voltage (e.g., as in the case of an inverter) to change the state of the RST signal, enabling longer durations for between margin delay. Example waveforms that may propagate through the memory circuit 400 are shown in FIG. 5.

Figure 5:
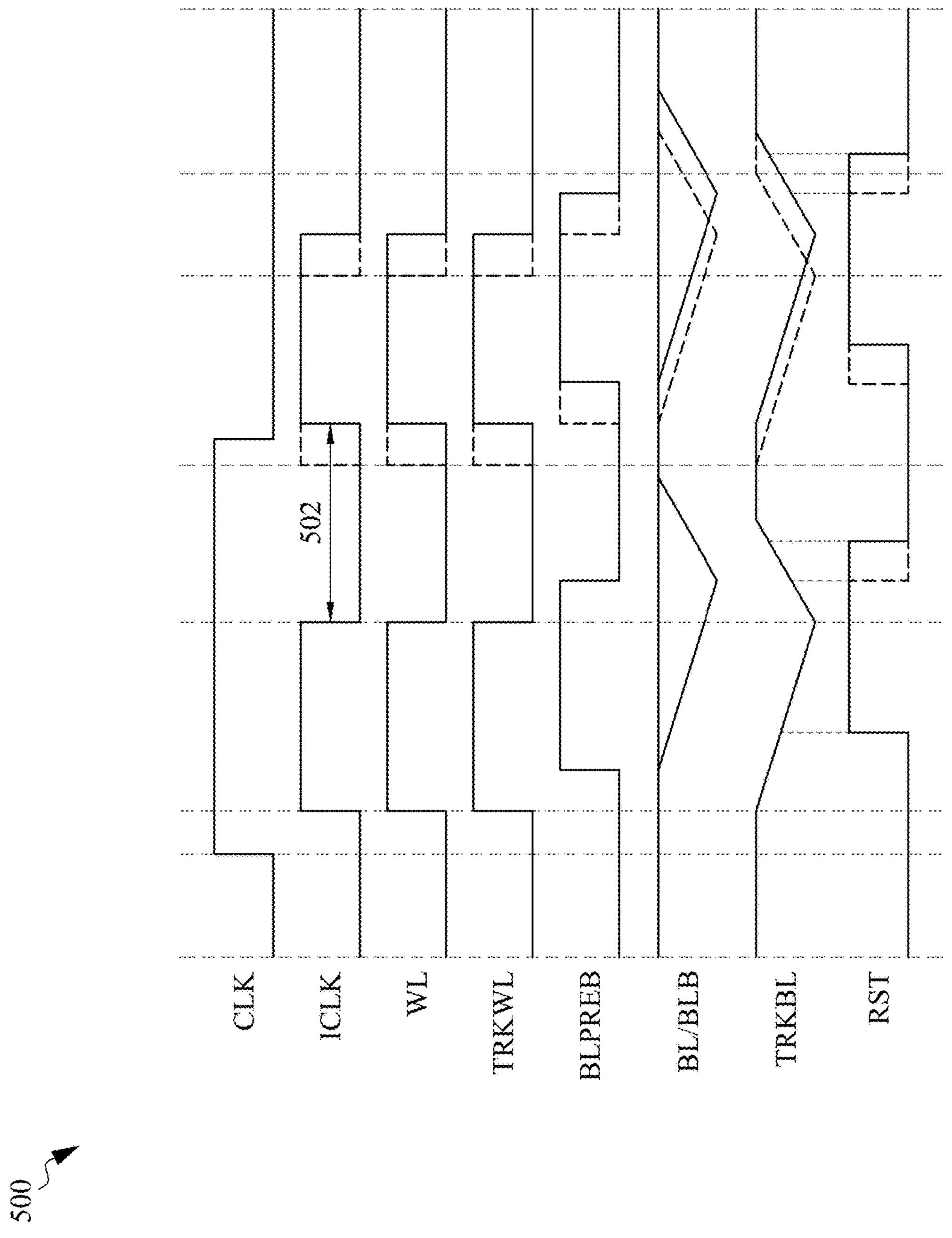
FIG. 5 illustrates a diagram of example waveforms of signals that can propagate through the memory circuit shown in FIG. 4 during memory operations, in accordance with some embodiments.

Referring to FIG. 5 in the context of the components described in connection with FIG. 4, illustrated is a diagram 500 of example waveforms of signals that can propagate through the memory circuit shown in FIG. 4 during memory operations, in accordance with some embodiments. The diagram 500 shows two read operations, one performed at a first port, and another performed at a second port of an example memory array (e.g., the memory array 102 of FIG. 1). Similar to the operations shown in FIG. 2, the memory operations are initiated at the rising edge of the input clock signal CLK causing a corresponding rising edge to be generated on the ICLK signal (e.g., by the clock generator circuit 413) with a slight delay due to the internal logic of the clock generator circuit.

As described in connection with FIG. 4, this causes the word line WL, the tracking word line TRKWL, and the pre-charge signal BLPREB to transition to a logic high state, selecting the memory cell 408, the TRK memory cell 410, and deactivating the pre-charging circuit 424 and the TRK pre-charging circuit 402. When the pre-charging circuit 424 and the TRK pre-charging circuit 402 are deactivated, the voltage at the tracking bit line TRKBL and the bit line BL begin to decrease over time. When the tracking bit line TRKBL reaches a threshold voltage of the Schmitt trigger of the trigger circuit 418, the reset signal RST transitions to a logic high state (e.g., about the supply voltage). In this example, the threshold of the Schmitt trigger to transition to the logic high state is about half of the supply voltage, but it should be understood that other thresholds are also possible.

As described herein, when the reset signal RST is asserted in the logic high state, the clock generator circuit 413 causes the ICLK signal to transition to the logic low state, after a suitable amount of delay (which may be implemented via the logic of the clock generator circuit 413). When the ICLK signal transitions to the logic low state, the word line WL, the tracking word line TRKWL, and the pre-charge signal BLPREB each transition to the logic low state. This causes the pre-charging circuit 424 and the TRK pre-charging circuit 402 to become activated, causing the voltage at the TRKBL node and the bit line BL to rise, as shown. When the TRKBL node rises to a second threshold voltage of the Schmitt trigger, the trigger circuit 418 causes the reset signal RST to transition to a logic low state. As shown, the threshold for transitioning to the logic low state is different from the threshold to transition to the logic high state. In this example, the threshold is closer to the supply voltage than half the supply voltage, as in the waveforms of FIG. 3.

When the reset signal RST is asserted in the logic low state, the clock generator circuit 413 causes the ICLK signal to transition to the logic high state, after a suitable amount of delay (which may be implemented via the logic of the clock generator circuit 413). This initializes a subsequent memory operation during the same clock period as the input clock signal (e.g., on a second memory port of the memory array). As shown, a similar operation to that described above is performed in response to the assertion of the ICLK signal in the logic high state. Waveforms corresponding to half the supply voltage are shown in dotted lines overlaying the solid-line waveforms. As shown, the use of different thresholds via the Schmitt trigger enables a greater between margin 502 period relative to in implementation using an inverter.

Figure 6:
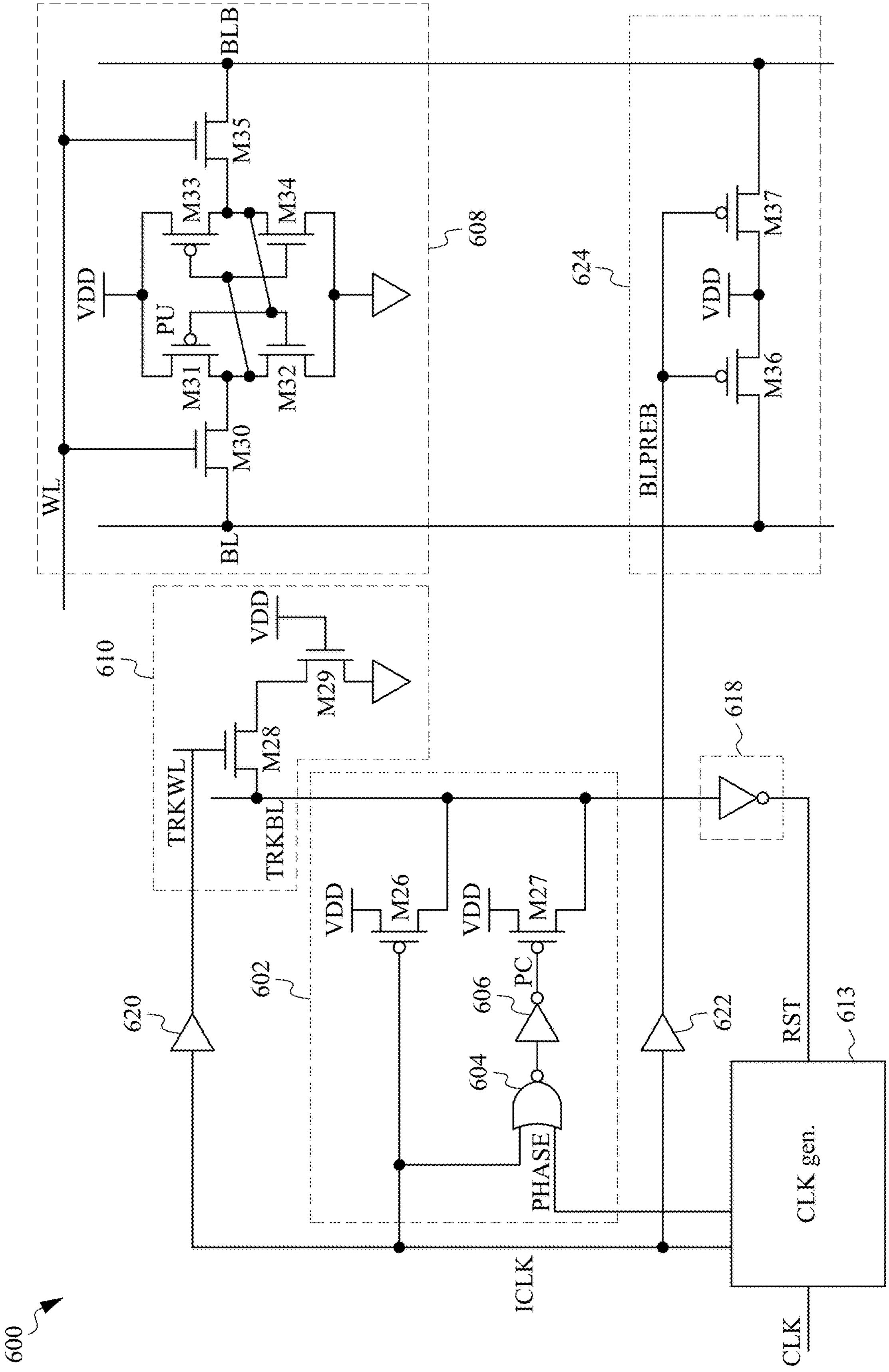
FIG. 6 illustrates a diagram of an example memory circuit including switched delay circuits to create different between margins for different memory cells, in accordance with some embodiments.

Referring to FIG. 6, illustrated is a diagram of an example memory circuit 600 including switched delay circuits to create different between margins for different memory cells, in accordance with some embodiments. The memory circuit 600 may implement similar functionality and may include similar structure to the memory circuit 200 shown in FIG. 2 and may be implemented as part of the memory system 100 of FIG. 1. Each of the components shown in the memory circuit 600 may receive power from one or more voltage sources such as the supply voltage VDD. The memory circuit 600 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 600 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like. It should be understood that the memory circuit 600 shown in FIG. 6 can be a portion of a larger memory circuit that includes memory cells (e.g., memory cells 108) and corresponding read/write circuitry. For example, although not shown here for visual clarity, various additional circuitry may be included to address (e.g., select) or otherwise access memory cells or to perform different memory operations, including but not limited to CIM operations, write operations, or read operations, among others.

The memory circuit 600 is shown as including the transistors M26, M27, M28, M29, M30, M31, M32, M33, M34, M35, M36, and M37. Transistors M26 and M27 are shown as part of the TRK pre-charging circuit 602. Transistors M28 and M29 are shown as part of the TRK memory cell 610. Transistors M30, M31, M32, M33, M34, and M260 are shown as part of the memory cell 608. The transistors M26 and M27 are shown as part of the pre-charging circuit 624. The clock generator circuit 613, the TRK memory cell 610, the pre-charging circuit 624, and the memory cell 608 can be similar to and include any of the structure and implement any of the functionality of the clock generator circuit 213, the TRK memory cell 210, the pre-charging circuit 224, and the memory cell 208, respectively, of the memory circuit 200 described in connection with FIG. 2.

Although each of the transistors M26-M37 of the memory circuit 600 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel. For example, each of the devices M26 and M27 may each include four transistors in parallel, and each of the transistors M36 and M37 can each include two transistors in parallel, in some implementations. Each of the source, drain, and gate terminals of the transistors M26-M37 can be connected in a similar manner to the source, drain, and gate terminals of the transistors M1-M12 described in connection with FIG. 2.

The memory circuit 600 includes the TRK pre-charging circuit 602, which is shown as including the NOR gate 604, the inverter 606, and the transistors M26 and M27. Each of the transistors M26 and M27, although shown as individual transistors, may each include two respective transistors in parallel and including similar connections to the components of the memory circuit 600. In this example, the TRK pre-charging circuit 602 receives the PHASE signal from the clock generator circuit 613. The clock generator circuit 613 can control the logical state of the PHASE signal based on the input clock signal CLK and the reset signal RST. The clock generator circuit 613 can transition the logical state of the PHASE signal in the logic high state when transitioning the ICLK signal from the logic low state to the logic high state. For example, if the PHASE signal is in the logic low state and the ICLK signal is transitioned to the logic high state, the clock generator circuit 613 can cause the PHASE signal to transition to the logic high state. Furthering this example, if the PHASE signal is in the logic high state and the ICLK signal is transitioned to the logic high state, the clock generator circuit 613 can cause the PHASE signal to transition to the logic low state. Examples of this transition are shown in FIG. 7.

As shown, the NOR gate 604 receives the ICLK signal and the PHASE signal as input and provides an output to the inverter 606 to generate the pre-charge signal PC. The pre-charge signal PC is in the logic high state when the ICLK signal or the PHASE signal are in the logic high state. If both the ICLK signal and the PHASE signal are in the logic low state, the pre-charge signal PC is in the logic low state. As shown, gate terminal of the transistor M26 is receives the ICLK signal and the transistor M27 receives the PC signal. As described in further detail in connection with FIG. 7, this enables the TRKBL to be recharged faster when the PHASE signal and the ICLK signal are in the logic low state, which turns on both the transistors M26 and M27 to charge the tracking bit line TRKBL.

Figure 7:
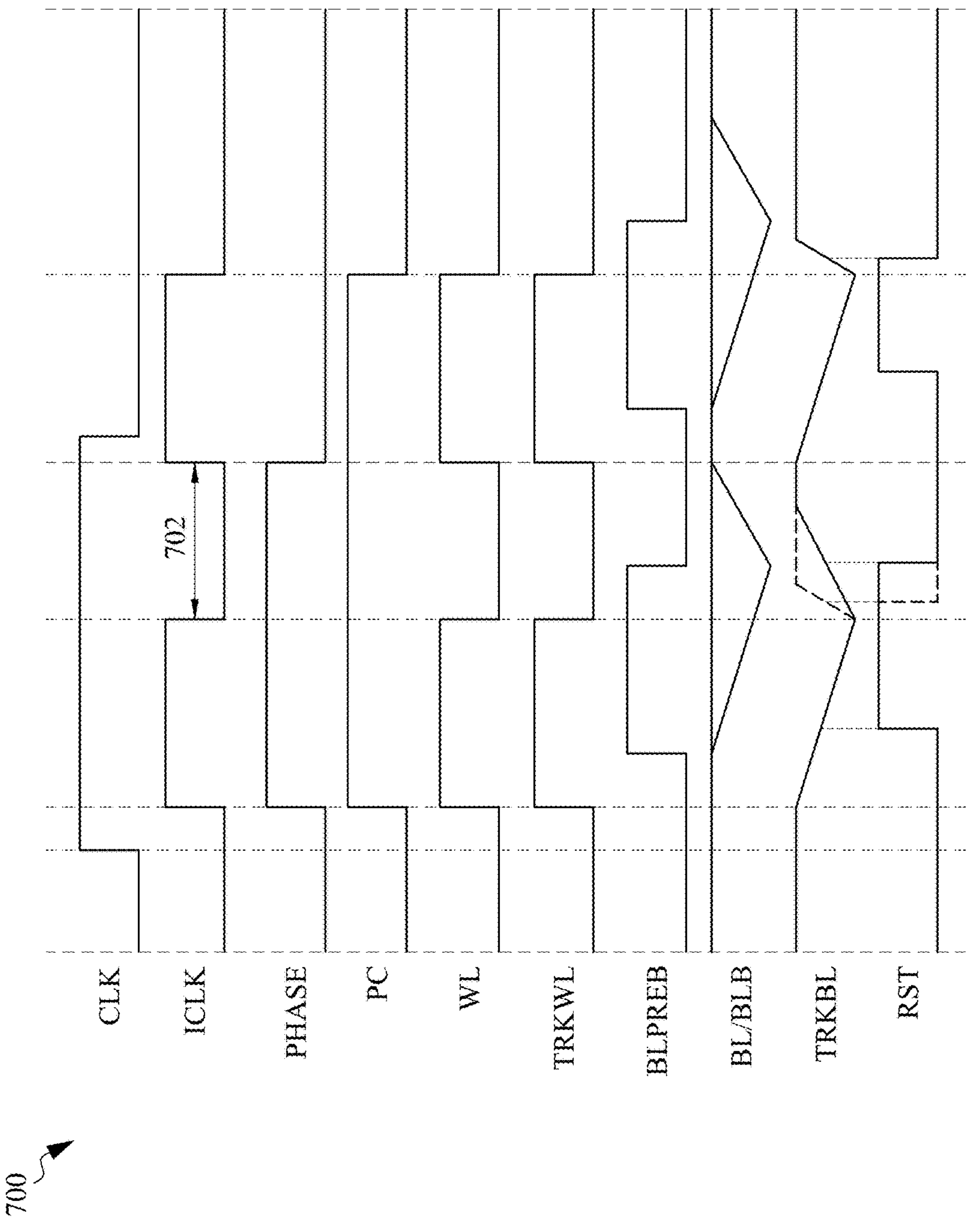
FIG. 7 illustrates a diagram of example waveforms of signals that can propagate through the memory circuit shown in FIG. 6 during memory operations, in accordance with some embodiments.

Referring to FIG. 7 in the context of the components described in connection with FIG. 6, illustrated is a diagram 700 of example waveforms of signals that can propagate through the memory circuit shown in FIG. 6 during memory operations, in accordance with some embodiments. The diagram 700 shows two read operations, one performed at a first port, and another performed at a second port of an example memory array (e.g., the memory array 102 of FIG. 1). Similar to the operations shown in FIG. 2, the memory operations are initiated at the rising edge of the input clock signal CLK causing a corresponding rising edge to be generated on the ICLK signal (e.g., by the clock generator circuit 613) with a slight delay due to the internal logic of the clock generator circuit.

Additionally, as shown, the clock generator circuit 613 causes the PHASE signal to transition to the logic high state. As either of the PHASE signal and the ICLK signal are both in the logic high state, the inverter 606 generates the PC signal in the logic high state. At this stage, both transistors M26 and M27 are turned off and not conducting due to the ICLK signals and PC signals, respectively, being in the logic high state. The word line signal WL, the tracking word line TRKWL, and the pre-charge signal BLPREB have also transitioned to a logic high state, as described herein, selecting the memory cell 608, the TRK memory cell 610, and deactivating the pre-charging circuit 624.

As the transistors M26 and M27 are turned off and not conducting, and because the transistors M28 and M29 are turned on and conducting, the voltage at the tracking bit line TRKBL begins to decrease (e.g., discharged via the transistors M28 and M29), as described herein. When the tracking bit line TRKBL reaches a threshold voltage of the trigger circuit 618 (e.g., which may include an inverter or a Schmitt trigger), the reset signal RST transitions to a logic high state (e.g., about the supply voltage). In this example, the threshold voltage is about half of the supply voltage VDD.

As described herein, when the reset signal RST is asserted in the logic high state, the clock generator circuit 613 causes the ICLK signal to transition to the logic low state, after a suitable amount of delay (which may be implemented via the logic of the clock generator circuit 613). When the ICLK signal transitions to the logic low state, the word line WL, the tracking word line TRKWL, and the pre-charge signal BLPREB each transition to the logic low state. This causes the pre-charging circuit 624 to become activated, causing the voltage at the bit line BL to rise, as shown. As shown, the PHASE signal remains in the logic high state, causing the PC signal to remain in the logic high state, keeping the transistor M27 turned off and not conducting. However, as the ICLK signal is in the logic high state, the transistor M26 is turned on and conducting, causing the TRKBL to recharge a first rate. As shown, the rate at which the TRKBL charges is slower than had both the transistors M26 and M27 been turned on simultaneously, which is indicated in the dotted line waveforms.

When the TRKBL node rises to a threshold voltage of the trigger circuit 618, the reset signal RST transitions to a logic low state. In this example, the threshold for transitioning to the logic low state is about half the supply voltage VDD. However, in some implementations (e.g., if a Schmitt trigger is used to implement hysteresis, etc.), other thresholds may be used that are different from the threshold to transition to the logic high state. When the reset signal RST is asserted in the logic low state, the clock generator circuit 613 causes the ICLK signal to transition to the logic high state, after a suitable amount of delay (which may be implemented via the logic of the clock generator circuit 613). This initializes a subsequent memory operation during the same clock period as the input clock signal (e.g., on a second memory port of the memory array).

As shown, a similar operation to that described above is performed in response to the assertion of the ICLK signal in the logic high state. When the ICLK signal is transitioned to the logic high state, the clock generator circuit transitions the PHASE signal to the logic low state. As the PHASE signal is in the logic low state, the PC signal is also set to logic low whenever the ICLK signal is in the logic low state. During the second memory operation, when the ICLK signal transitions to the logic low state, both transistors M26 and M27 are turned on and conduct, enabling a faster charge time for the tracking bit line TRKBL relative to the first memory operation, as shown.

Figure 8:
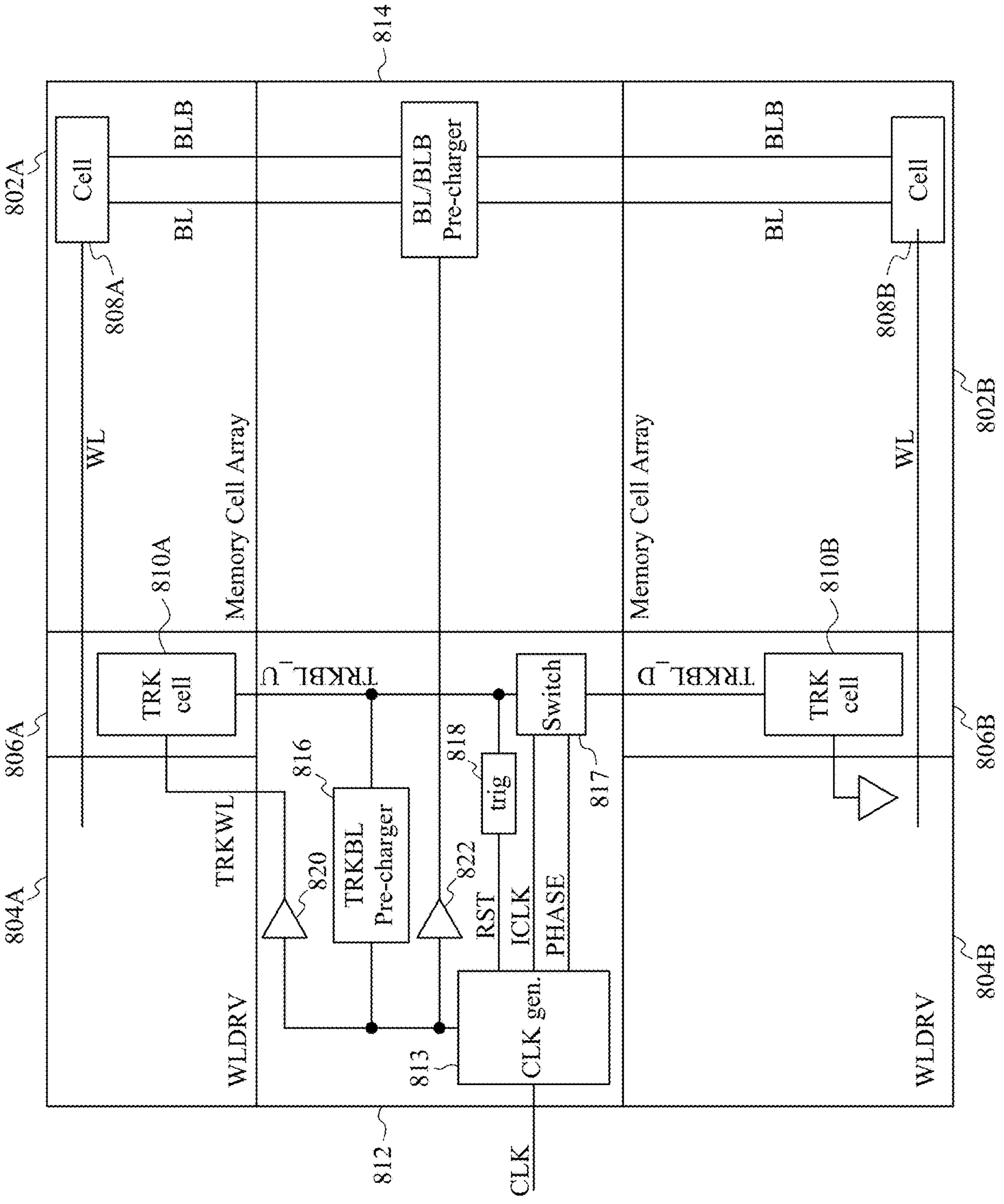
FIG. 8 illustrates a diagram of an example memory system including delay circuits that switch between tracking cell load to create sufficient between margin, in accordance with some embodiments.

FIG. 8 illustrates a diagram of an example memory system 800 including delay circuits that switch between tracking cell load to create sufficient between margin, in accordance with some embodiments. The memory system 800 can be included in any type of memory device or IC device. In at least one embodiment, a memory device is an individual IC device. In some embodiments, a memory device is included as a part of a larger IC device which comprises circuitry other than the memory device for other functionalities. The memory system 800 can be similar to, and include any of the structure and functionality of, the memory system 100 of FIG. 1.

Various embodiments of the circuits and logic gates that implement the memory system 800 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like. It should be understood that the memory system 800 shown in FIG. 8 can be a portion of a larger memory system that includes memory cells (e.g., memory cells 108) and corresponding read/write circuitry. For example, although not shown here for visual clarity, various additional circuitry may be included to address (e.g., select) or otherwise access memory cells or to perform different memory operations, including but not limited to CIM operations, write operations, or read operations, among others.

It should be understood that although the memory system 800 shown in FIG. 8 can be a portion of a larger memory circuit, including any number of pairs of bit lines BL and BLB or write lines WL, which may be addressed by corresponding memory cell selection circuitry. Likewise, although not shown here for visual clarity, various additional circuitry may be included to address (e.g., select) various portions of the memory cells or to perform different memory operations, such write operations or read operations, among others.

The memory system 800 is shown as including multiple memory arrays 802A and 802B, each of which include one or more respective memory cells 808A and 808B. The memory arrays 802A and 802B may each be similar to and include any of the structure of and implement any of the functionality of the memory array 102 of FIG. 1. The memory cells 808A and 808B may be similar to and include any of the structure of and implement any of the functionality of the memory cell 108 of FIG. 1. In some implementations, the memory arrays 802A and 802B share a set of bit lines BL and BLB.

The bit lines BL and BLB, and the memory cells 808A and 808B coupled therebetween, can be included as a portion of a column of the memory arrays 802A and 802B, in some implementations. The memory system 800 is shown as including an input/output (I/O) circuit 814, which includes the pre-charging circuit 824 coupled to the bit lines BL and BLB. As shown, a pre-charge circuit 824 is coupled to the bit lines BL and BLB, which may be similar to and include any of the structure and functionality of the pre-charge circuit 124 of FIG. 1. Although not shown here for visual clarity, in some implementations, multiple memory cells 808A or 808B of the memory arrays 802A and 802B may be arranged in multiple rows and coupled to each of the pair of bit lines BL and BLB. The memory arrays 802A and 802B can include multiple columns, which each column including a corresponding set of bit lines having multiple memory cells 808A and 808B coupled thereto.

The memory system 800 is shown as including a control circuit 812, which can be similar to and implement any of the structure or functionality of the control circuit 112 of FIG. 1. As shown, the control circuit 812 includes a clock generator circuit 813. The clock generator circuit 813 is shown as receiving a clock signal CLK and generating an internal clock signal ICLK and a phase signal PHASE, which may be similar to the PHASE signal described in connection with FIGS. 6 and 7. The clock generator circuit 813 can include any type of circuitry to generate an ICLK signal and a PHASE signal as a function of the input clock signal CLK.

The memory system 800 is shown as including word line driver circuits 804A and 804B, which may be similar to and implement any of the structure or functionality of the word line driver circuit 104 of FIG. 1. The word line driver circuits 804A and 804B can each include one or more word lines that select a respective row of memory cells in the memory arrays 802A and 802B, respectively. The word line driver circuits 804A or 804B, when activated, can generate an activation signal on the corresponding WL coupled to the memory cell 808A or 808B to select that memory cell for a memory operation. The memory system 800 is shown as including corresponding tracking memory cell arrays 806A and 806B, each of which may be similar to the tracking memory array 106.

Figure 9:
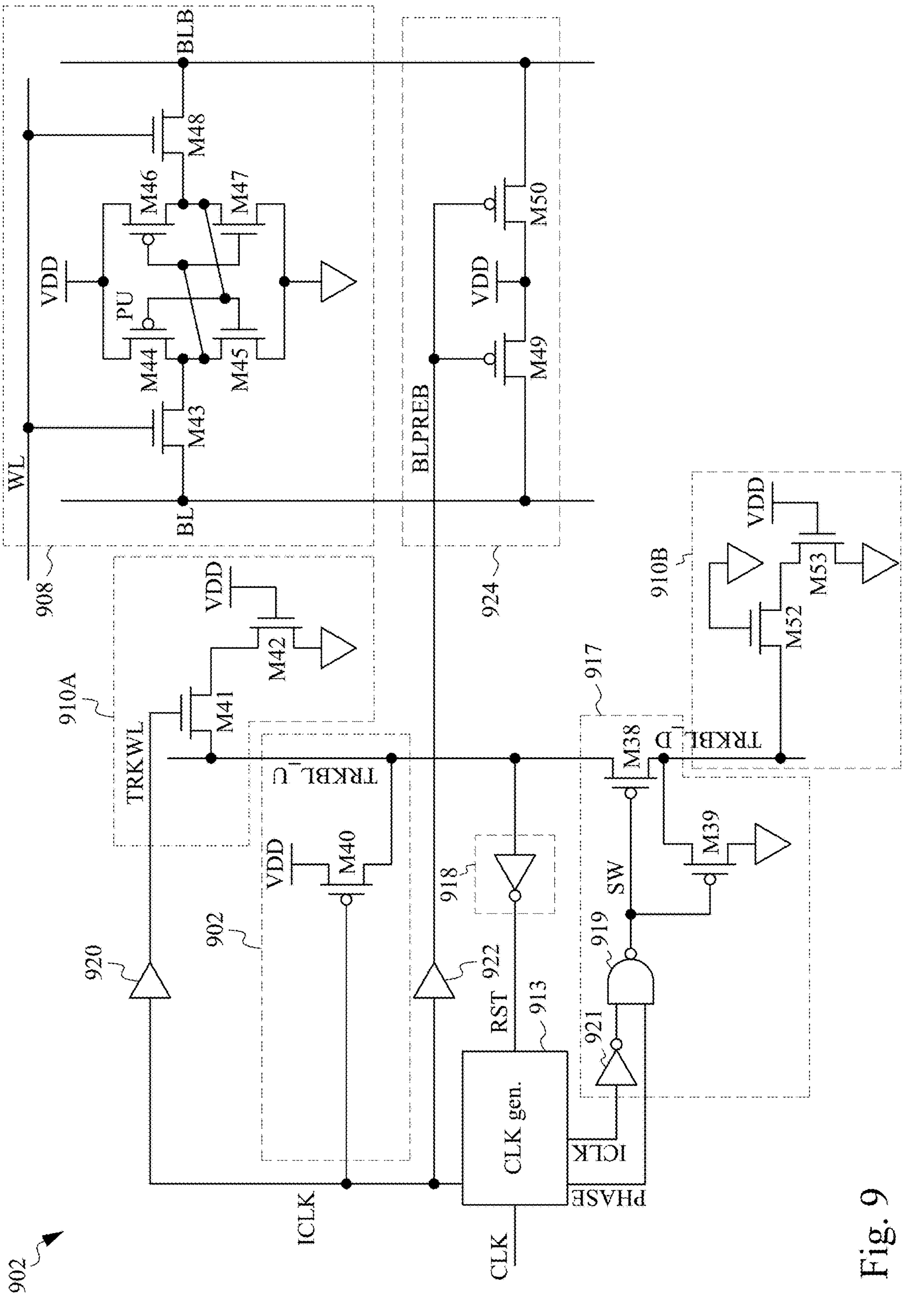
FIG. 9 illustrates an example circuit diagram implementing the memory system of FIG. 8, in accordance with some embodiments.

Each tracking memory cell array 806A and 806B can include one or more corresponding sets of tracking memory cells 810A or 810B. An example circuit including an example structure of the tracking memory cells 810A and 810B is shown in FIG. 9. The tracking memory cells 810A and 810B can mimic the electrical characteristics of the memory cells 808A and 810B, respectively, with respect to WL activation and bit line pre-charging/discharging.

The ICLK signal generated by the clock generator circuit 813 is provided as input to the buffers 820 and 822. The buffers 820 and 822 may include any even number of inverters to buffer the ICLK signal, to preserve signal strength during transmission to other circuits in the memory system 800 or to introduce a small amount of delay. The buffer 820 provides a buffered ICLK signal as input to the tracking memory cell 810 as the tracking word line (TRKWL) signal, which mimics the assertion of the word line WL by the word line driver 804. As shown, the tracking (TRK) memory cell 810 is coupled to the tracking bit line (TRKBL), which mimics the electrical characteristics of the bit line BL.

The control circuit 812 is shown as including the TRK pre-charging circuit 816, which can receive the ICLK signal and control the voltage level of the TRKBL_U node (corresponding to the upper TRK memory array 806A) coupled to the TRK memory cell 810A. The TRK pre-charging circuit 816 can be similar to any of the TRK pre-charging circuits described herein (e.g., the TRK pre-charging circuit 116, the TRK pre-charging circuit 202, the TRK pre-charging circuit 402, the TRK pre-charging circuit 602, etc.). Further details of the TRK pre-charging circuit 816 are described in connection with FIG. 9. The TRKBL_U (corresponding to the upper TRK memory array 806A) is coupled to the reset trigger circuit 818, which controls the reset signal RST for the clock generator circuit 813. Waveforms corresponding to the signals shown in the memory system 800 are described in further detail in connection with FIG. 12.

As shown, the TRKBL_U node is coupled to the switching circuit 817, which receives the PHASE signal and the ICLK signal as input. The switching circuit 817 can switch between the upper and lower memory arrays 802A and 802B according to the memory operation being performed. This enables selection of the TRKBL_D node or the TRKBLU node for mimicking the performance of the bit lines BL and BLB to create sufficient between margin. Further details relating to the switching circuit 817 are described in connection with FIG. 9.

Referring to FIG. 9, illustrated is an example circuit diagram implementing the memory system of FIG. 8, in accordance with some embodiments. The memory circuit 900 may implement similar functionality and may include similar structure to the memory circuit 200 shown in FIG. 2 and may be implemented as part of the memory system 800 of FIG. 8. Each of the components shown in the memory circuit 900 may receive power from one or more voltage sources such as the supply voltage VDD. The memory circuit 900 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 900 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like. It should be understood that the memory circuit 900 shown in FIG. 9 can be a portion of a larger memory circuit that includes memory cells (e.g., memory cells 818A or 818B) and corresponding read/write circuitry. For example, although not shown here for visual clarity, various additional circuitry may be included to address (e.g., select) or otherwise access memory cells or to perform different memory operations, including but not limited to CIM operations, write operations, or read operations, among others.

The memory circuit 900 is shown as including the transistors M40, M15, M41, M42, M43, M44, M45, M46, M47, M400, M401, and M401. Transistors M40 and M15 are shown as part of the TRK pre-charging circuit 902. Transistors M41 and M42 are shown as part of the TRK memory cell 910. Transistors M43, M44, M45, M46, M47, and M400 are shown as part of the memory cell 908. The transistors M401 and M402 are shown as part of the pre-charging circuit 924. The TRK pre-charging circuit 902, the clock generator circuit 913, the TRK memory cells 910A and 910B, the pre-charging circuit 924, and the memory cell 908 can be similar to and include any of the structure and implement any of the functionality of the TRK pre-charging circuit 202, the clock generator circuit 213, the TRK memory cell 210, the pre-charging circuit 224, and the memory cell 208, respectively, of the memory circuit 200 described in connection with FIG. 2.

Although each of the transistors M40-M50 of the memory circuit 900 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel. For example, each of the devices M40 and M15 may each include four transistors in parallel, and each of the transistors M49 and M50 can each include two transistors in parallel, in some implementations. Each of the source, drain, and gate terminals of the transistors M40-M50 can be connected in a similar manner to the source, drain, and gate terminals of the transistors M1-M12 described in connection with FIG. 2.

As shown, the drain terminal of the transistors M41 and M52 of the tracking memory cells 910A and 910B are coupled to the TRKBL_U and TRKBL_D nodes, respectively. In this example, the TRKBL_U node is similar to the TRKBL node of FIG. 2 and is coupled to the trigger circuit 918 and the TRK pre-charging circuit 902. The switching circuit 917 (which may be similar to and implement any of the structure and functionality of the switching circuit 817 of FIG. 8) is shown as including the inverter 921, the NAND gate 919, and the transistors M38 and M39. The transistor M39 can include an nMOSFET device and the transistor M38 can include a pMOSFET device, in some implementations. The inverter 921 generates an inverted ICLK signal that is provided as input to the NAND gate 919, which also receives the PHASE signal from the clock generator circuit 913 as input.

The NAND gate 919 generates the switch signal SW in a logic low state when the inverted clock signal and the PHASE signal are both in the logic high state and generates the switch signal SW in the logic high state otherwise. The SW signal is provided to the gate terminals of the transistors M38 and M39. The drain terminal of the transistor M38 is coupled to the TRKBL_D node and the source terminal of the transistor M38 is coupled to the TRKBL_U node, as shown. The drain terminal of the transistor M39 is coupled to the TRKBL_D node and the source terminal of the transistor M39 is coupled to a ground voltage, as shown.

When the switch signal SW is in a logic high state, the transistor M38 is turned off and does not conduct and the transistor M39 turns on and conducts, causing the TRKBL_D node to discharge to about the ground voltage. When the switch signal SW is in a logic low state, the transistor M38 is turned on and conducts while the transistor M39 turns off and does not conduct, causing the TRKBL_D node to be electrically coupled to the TRKBL_U node via the transistor M39. If the ICLK signal is in a logic low state in that scenario, both the TRKBL_U node and the TRKBL_D node can be charged to about the supply voltage via the transistor M40.

As shown, the TRK pre-charging circuit 902 includes a single transistor (or in some implementations, four transistors in parallel with one another), with a drain terminal coupled to the TRKBL_U node and a source voltage coupled to the supply voltage VDD. As shown, the trigger circuit 918 (which may include an inverter or a Schmitt trigger, as described herein, is coupled to the TRKBL_U node and generates the reset signal RST as described herein. Further details of how signals propagate through the memory circuit 900 of FIG. 9 are described in connection with FIG. 10.

Figure 10:
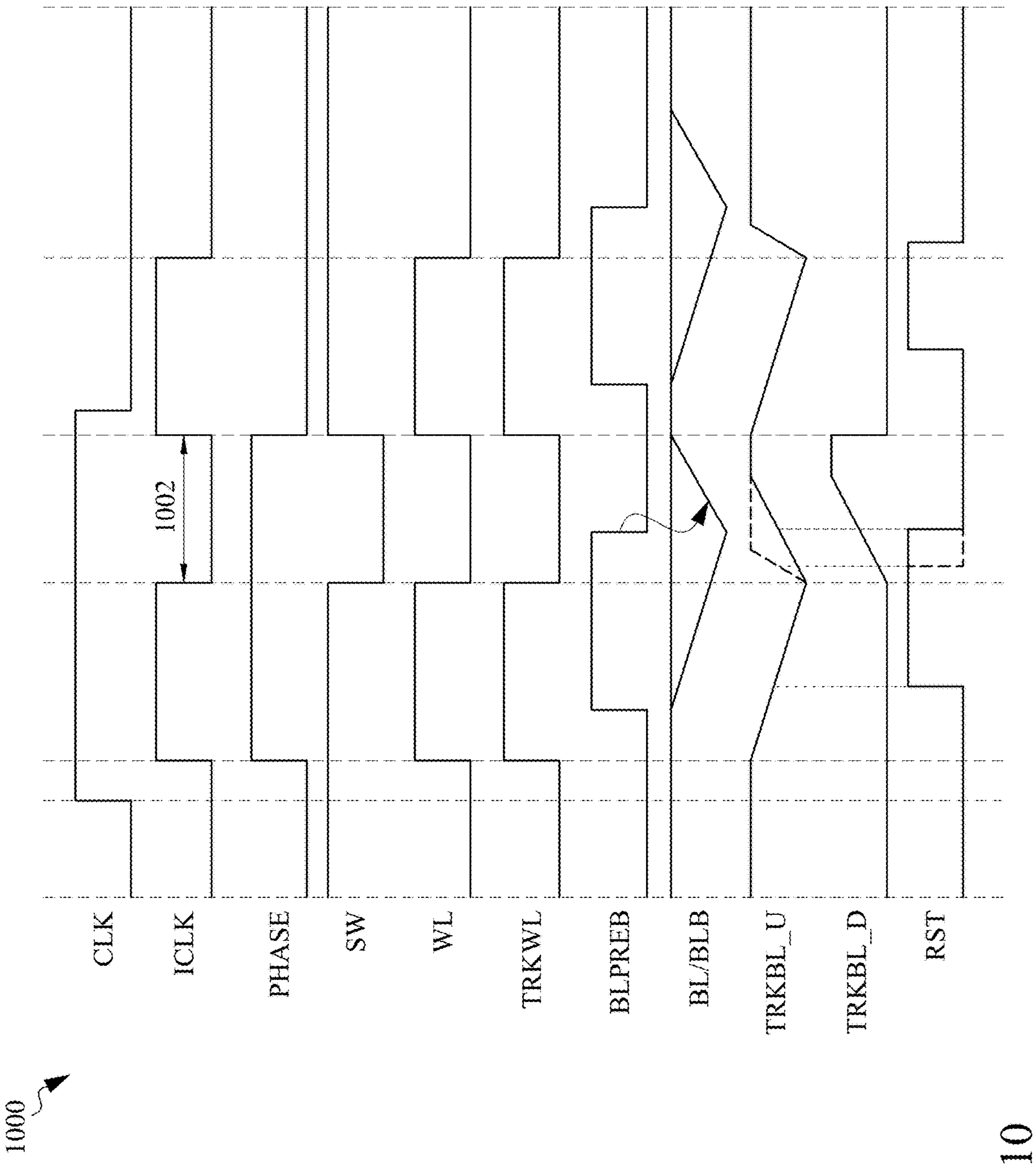
FIG. 10 illustrates a diagram of example waveforms of signals that can propagate through the memory circuit shown in FIG. 9 during memory operations, in accordance with some embodiments.

Referring to FIG. 10, illustrated is a diagram 1000 of example waveforms of signals that can propagate through the memory circuit 900 shown in FIG. 9 during memory operations, in accordance with some embodiments. The diagram 1000 shows two read operations, one performed at a first port, and another performed at a second port of an example memory array (e.g., the memory array 102 of FIG. 1). Similar to the operations shown in FIG. 2, the memory operations are initiated at the rising edge of the input clock signal CLK causing a corresponding rising edge to be generated on the ICLK signal (e.g., by the clock generator circuit 913) with a slight delay due to the internal logic of the clock generator circuit.

Additionally, as shown, the clock generator circuit 913 causes the PHASE signal to transition to the logic high state. As either of the PHASE signal and the logical inversion of the ICLK signal are both in the logic high state, the NAND gate 919 generates the switch signal SW signal in the logic high state. At this stage, the transistors M40 and M38 are turned off and not conducting, and the transistor M39 is turned on and conducting, pulling the voltage of the TRKBL_D line to about the ground voltage. The word line signal WL, the tracking word line TRKWL, and the pre-charge signal BLPREB have also transitioned to a logic high state, as described herein, selecting the memory cell 908, the TRK memory cell 910A, and deactivating the pre-charging circuit 924. The TRK memory cell 910B is deselected as the gate terminal of M52 is coupled to the ground voltage.

As the transistor M38 is turned off and not conducting, and because the transistor s M41 and M42 are turned on and conducting, the voltage at the tracking bit line TRKBL_U begins to decrease (e.g., discharged via the transistors M28 and M29), as described herein. When the tracking bit line TRKBL_U reaches a threshold voltage of the trigger circuit 918 (e.g., which may include an inverter or a Schmitt trigger), the reset signal RST transitions to a logic high state (e.g., about the supply voltage). In this example, the threshold voltage is about half of the supply voltage VDD.

As described herein, when the reset signal RST is asserted in the logic high state, the clock generator circuit 913 causes the ICLK signal to transition to the logic low state, after a suitable amount of delay (which may be implemented via the logic of the clock generator circuit 913). When the ICLK signal transitions to the logic low state, the word line WL, the tracking word line TRKWL, and the pre-charge signal BLPREB each transition to the logic low state. This causes the pre-charging circuit 924 to become activated, causing the voltage at the bit line BL to rise, as shown. As the logical inverse of the ICLK signal and the PHASE signal are in the logic high state, the NAND gate 919 generates the switch signal SW in the logic low state, causing the transistor M38 to turn on and conduct and the transistor M39 to turn off and not conduct. This causes the TRKBL_D node to be electrically coupled to the TRKBL_U node via the transistor M38 and causes these nodes to charge up to the supply voltage, as shown.

When the TRKBL_U/TRKBL_D nodes rise to a threshold voltage of the trigger circuit 918, the reset signal RST transitions to a logic low state. In this example, the threshold for transitioning to the logic low state is about half the supply voltage VDD. However, in some implementations (e.g., if a Schmitt trigger is used to implement hysteresis, etc.), other thresholds may be used that are different from the threshold to transition to the logic high state. When the reset signal RST is asserted in the logic low state, the clock generator circuit 913 causes the ICLK signal to transition to the logic high state, after a suitable amount of delay (which may be implemented via the logic of the clock generator circuit 913). This initializes a subsequent memory operation during the same clock period as the input clock signal (e.g., on a second memory port of the memory array).

As shown, a similar operation to that described above is performed in response to the assertion of the ICLK signal in the logic high state. When the ICLK signal is transitioned to the logic high state, the clock generator circuit transitions the PHASE signal to the logic low state. This causes the switch signal SW to transition to the logic high state, turning off the transistor M38 and turning on the transistor M39, causing the voltage at the node TRKBL_D to be decoupled from the voltage at the node TRKBL_U, and causing the voltage at the node TRKBL_D to discharge to about the ground voltage, as shown. During the second memory operation, when the ICLK signal transitions to the logic low state, the transistor M40 is turned on while the transistor M38 remains off, enabling a faster charge time for the tracking bit line TRKBL_U node relative to the first memory operation, as shown.

Figure 11:
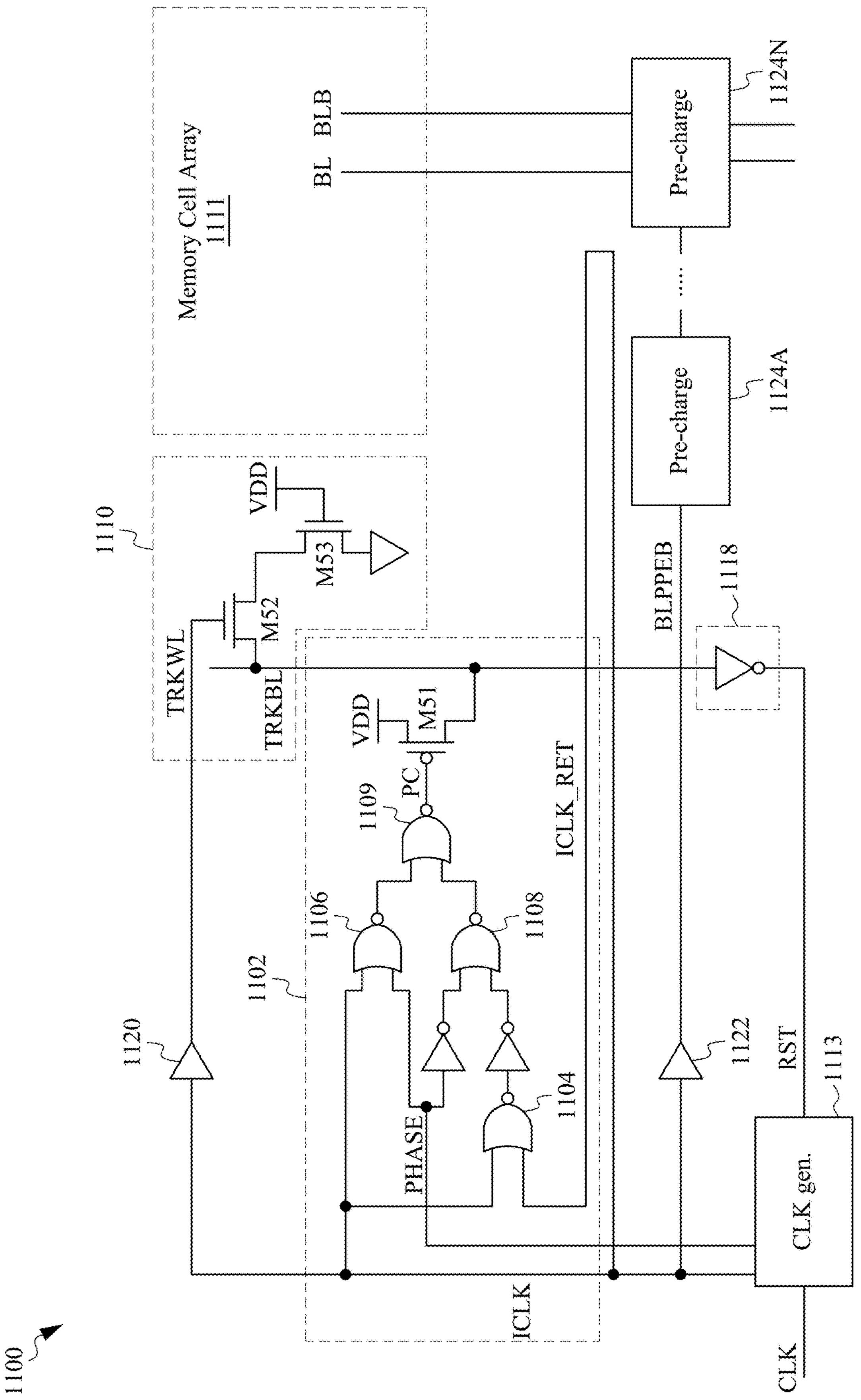
FIG. 11 illustrates a diagram of an example memory circuit including delay circuits that track input/output directional wiring to create sufficient between margin for different memory cells, in accordance with some embodiments.

Referring to FIG. 11, illustrated is a diagram of an example memory circuit 1100 including delay circuits that track input/output directional wiring to create sufficient between margin for different memory cells, in accordance with some embodiments. The memory circuit 1100 may implement similar functionality and may include similar structure to the memory circuit 200 shown in FIG. 2 and may be implemented as part of the memory system 100 of FIG. 1. Each of the components shown in the memory circuit 1100 may receive power from one or more voltage sources such as the supply voltage VDD. The memory circuit 1100 may include one or more logic gates and sub-circuits, each of which may be constructed from one or more logic gates. Logic gates are electronic devices that perform logical operations on one or more input signals to produce a single output signal.

Various embodiments of the circuits and logic gates that implement the memory circuit 1100 may include various transistors. The transistors described herein may have a certain type (n-type or p-type), but embodiments are not limited thereto. The transistors can be any suitable type of transistor including, but not limited to, MOSFET, CMOS transistors, PMOS, NMOS, BJT, high voltage transistors, high frequency transistors, PFETs/NFETs, FinFETs, planar MOS transistors with raised source/drains, nanosheet FETs, nanowire FETs, or the like. It should be understood that the memory circuit 1100 shown in FIG. 11 can be a portion of a larger memory circuit that includes memory cells (e.g., memory cells 108) and corresponding read/write circuitry. For example, although not shown here for visual clarity, various additional circuitry may be included to address (e.g., select) or otherwise access memory cells or to perform different memory operations, including but not limited to CIM operations, write operations, or read operations, among others.

The memory circuit 1100 is shown as including the transistors M51, M52, and M53. Transistor M51 is shown as part of the TRK pre-charging circuit 1102 and transistors M52 and M53 are shown as part of the TRK memory cell 1110. The clock generator circuit 1113, the TRK memory cell 1110, the pre-charging circuits 1124A-1124N (sometimes generally referred to as the "pre-charging circuit(s) 1124," and the memory cell array 1111 can be similar to and include any of the structure and implement any of the functionality of the clock generator circuit 213, the TRK memory cell 210, the pre-charging circuit 224, and the memory cell array 102, respectively, of the memory circuit 200 described in connection with FIGS. 1 and 2.

Although each of the transistors M51-M53 of the memory circuit 1100 are shown as one transistor, embodiments are not limited thereto. For example, each of the transistors may include multiple transistors ("sub-transistor(s)") that are connected to one another in parallel. For example, in an embodiment, each of the sub-transistors of any transistor described herein can include respective gate, drain, and source terminals, each of which may be connected to one another in parallel, of the source, drain, and gate terminals of the transistors M52 and M53 can be connected in a similar manner to the source, drain, and gate terminals of the transistors M3 and M4 described in connection with FIG. 2.

Figure 13:
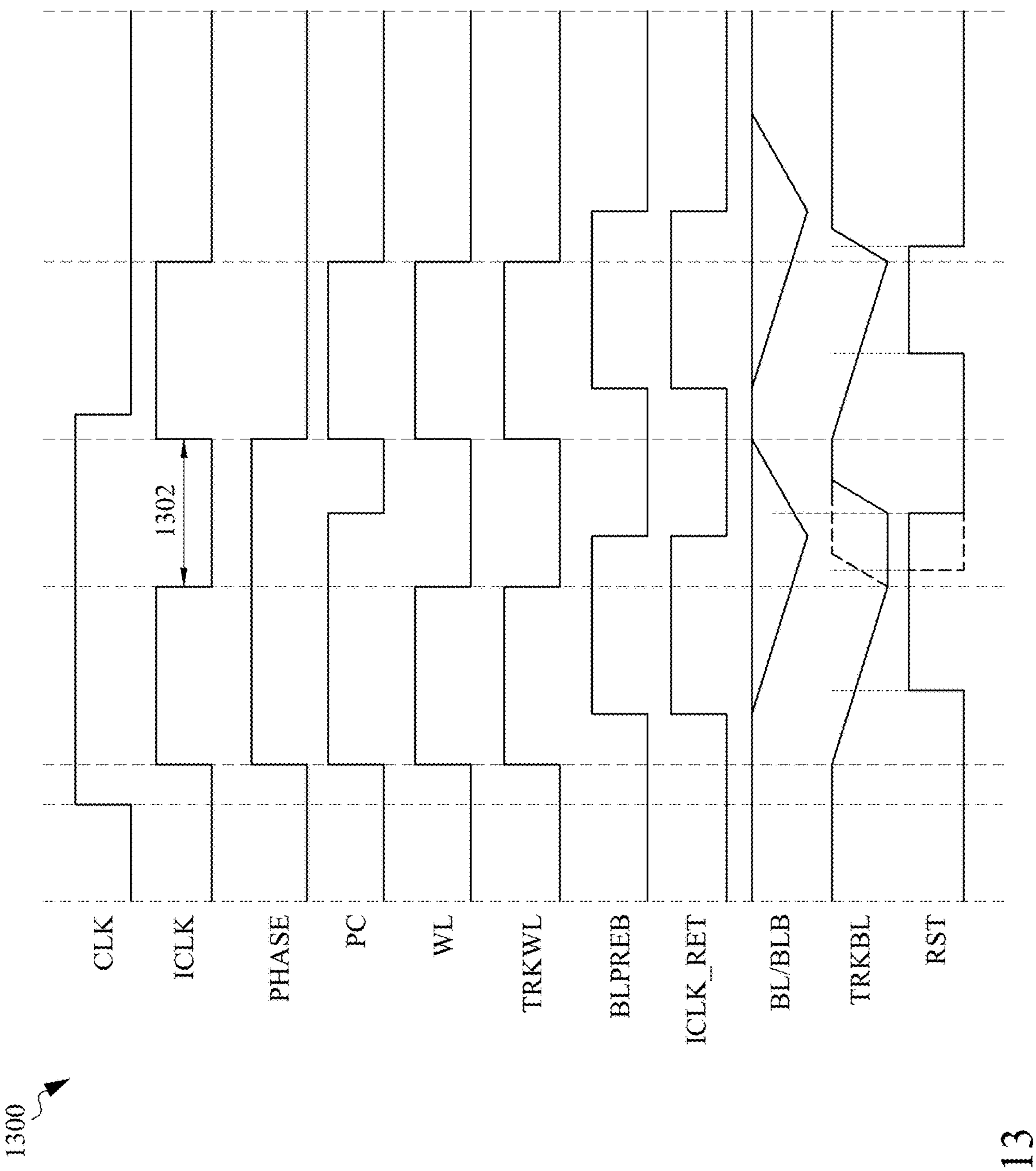
FIG. 13 illustrates a diagram of example waveforms of signals that can propagate through the memory circuit shown in FIG. 11 during memory operations, in accordance with some embodiments.

The memory circuit 1100 includes the TRK pre-charging circuit 1102, which is shown as including a first NOR gate 1104, a second NOR gate 1106, a third NOR gate 1108, and a fourth NOR gate 1109. The transistor M51 includes one or more pMOSFET transistors, in some implementations. In this example, the TRK pre-charging circuit 1102 receives the PHASE signal and the ICLK signal from the clock generator circuit 1113. The clock generator circuit 1113 can control the logical state of the PHASE signal based on the input clock signal CLK and the reset signal RST. The clock generator circuit 1113 can transition the logical state of the PHASE signal in the logic high state when transitioning the ICLK signal from the logic low state to the logic high state. For example, if the PHASE signal is in the logic low state and the ICLK signal is transitioned to the logic high state, the clock generator circuit 1113 can cause the PHASE signal to transition to the logic high state. Furthering this example, if the PHASE signal is in the logic high state and the ICLK signal is transitioned to the logic high state, the clock generator circuit 1113 can cause the PHASE signal to transition to the logic low state. Examples of this transition are shown in FIG. 13.

As shown, the first NOR gate 1104 receives the ICLK signal and an internal clock return signal ICLK_RET. The internal clock return signal ICLK_RET can be a signal generated by propagating the ICLK signal along a path that mimics the electrical characteristics (e.g., resistance, capacitance, etc.) and delay of the path taken by the pre-charge signal BLPREB through the pre-charging circuits 1124A-1124N. In some implementations, the pathway via which the ICLK_RET signal is generated may include one or more buffers (e.g., a series of inverters) to match the delay of propagating the BLPREB signal.

The second NOR gate 1106 of the TRK pre-charging circuit 1102 receives the ICLK signal and the PHASE signal from the clock generator circuit 1113. The output of the second NOR gate 1106 is in the logic high state when neither of the PHASE and ICLK signals are in the logic high state and is in a logic low state otherwise. The output of the first NOR gate 1104 is in the logic high state when neither of the ICLK and ICLK_RET signals are in the logic high state and is in a logic low state otherwise. The third NOR gate 1108 receives inverted outputs of the first NOR gate 1104 and the PHASE signal. When the inverted output of the first NOR gate 1104 is in the logic high state (e.g., if either the ICLK signal or the ICLK_RET signal is in the logic high state) and the inverted phase signal is in the logic high state, the output of the third NOR gate 1108 is in the logic low state. Otherwise, the output of the third NOR gate 1108 is in the logic low state. The fourth NOR gate 1109 receives the output of the second and third NOR gates 1106 and 1108, as shown, and generates the active-low pre-charge signal PC, which is coupled to a gate terminal of the transistor M51.

The source terminal of the transistor M51 is coupled to the supply voltage VDD and the drain terminal of the transistor M51 is coupled to the to the tracking bit line TRKBL. As described herein, the tracking bit line TRKBL is coupled to the trigger circuit 1118, which may include an inverter or Schmitt trigger to generate the reset signal RST for the clock generator circuit 1113. Using the TRK pre-charging circuit 1102, the timing to start pre-charging of the tracking bit line TRKBL can be switched between the timing of the ICLK signal or the timing of the ICLK_RET using different states of the PHASE signal. When the PHASE signal is in the logic low state, the pre-charging begins according to the timing of the ICLK signal. When the PHASE signal is in the logic high state, pre-charging begins according to the timing of the ICLK_RET signal, which allows the tracking bit line TRKBL to begin pre-charging in synchronization with the pre-charging timing of the bit lines BL/BLB, while mimicking the wiring resistance of the BLPREB signal to ensure sufficient between margin. Further details of the timing for the TRK pre-charging circuit 1102 are described in connection with FIG. 13.

Figure 12:
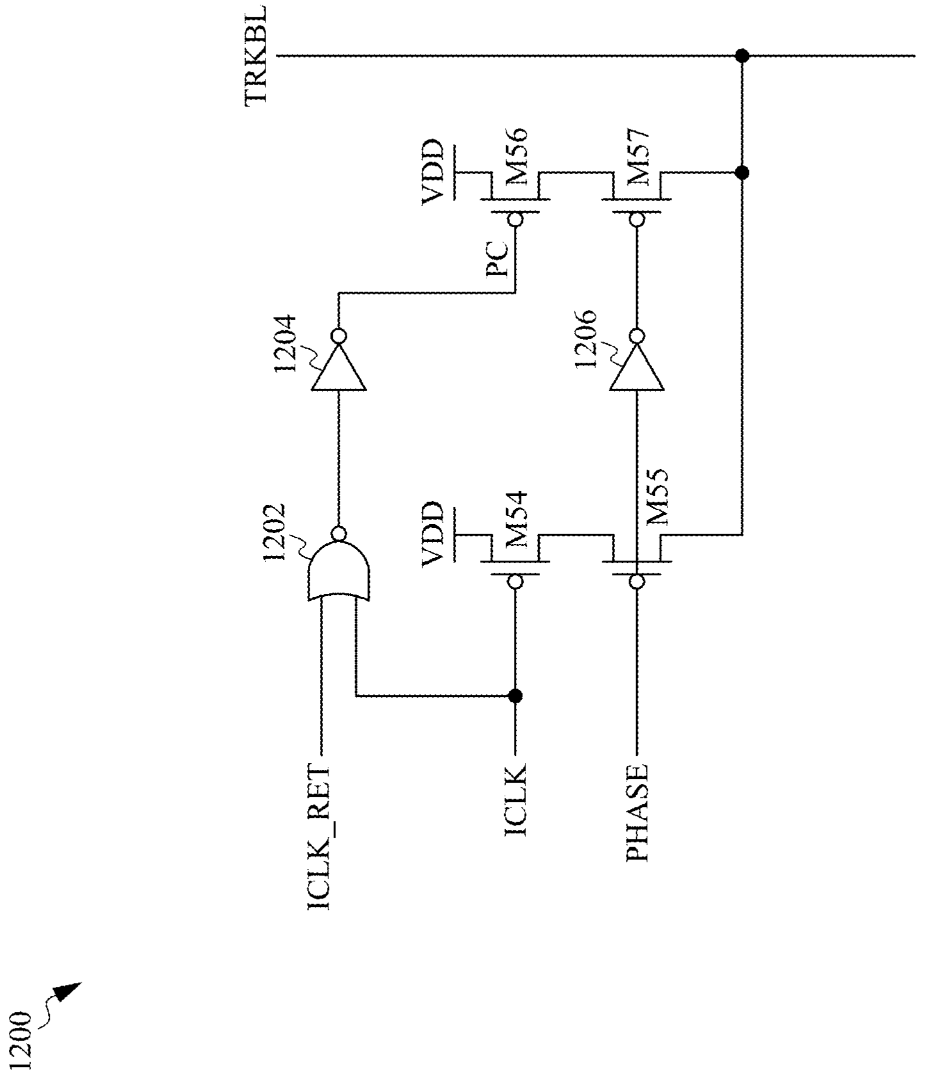
FIG. 12 illustrates a diagram of an example tracking pre-charging circuit that may be included in FIG. 11, in accordance with some embodiments.

Referring to FIG. 12 in the context of the components described in connection with FIG. 11, illustrated is a diagram of an example tracking pre-charging circuit 1200 that may be included in FIG. 11, in accordance with some embodiments. In some implementations, the tracking pre-charging circuit 1200 can be an alternative to the TRK pre-charging circuit 1102 of FIG. 11. The tracking pre-charging circuit 1200 is shown as including four transistors M54, M55, M56, and M57, each of which can be pMOSFET transistors. The tracking pre-charging circuit 1200 is also shown as including a NOR gate 1202, a first inverter 2014, and a second inverter 1206. Each of the transistors M54, M55, M56, and M57, although shown as single devices, may include any number of.

The output of the NOR gate 1202 is provided as input to the first inverter 1204, which generates the pre-charge signal PC. The NOR gate 1202 coupled to the first inverter 1204 is logically equivalent to an OR gate, and therefore the PC signal is in a logic low state when both of the ICLK or ICLK_RET signals are in the logic low state and is in the logic high state otherwise. As shown, the source terminals of the transistors M54 and M56 are coupled to the supply voltage VDD, and the source terminals of the transistors M55 and M57 are coupled to the drain terminals of the transistors M54 and M56, respectively. The gate terminal of the transistor M54 is coupled to the ICLK signal, the gate terminal of the transistor M55 is coupled to the PHASE signal, the gate terminal of the transistor M57 is coupled to an inverted PHASE signal (e.g., generated by the second inverter 1206), and the gate terminal of the transistor M56 is coupled to the pre-charge signal PC. The drain terminals of the transistors M55 and M57 are each coupled to the TRKBL node. Further details of the timing for the TRK pre-charging circuit 1200 are described in connection with FIG. 13.

Referring to FIG. 13 in the context of the components described in connection with FIGS. 11 and 12, illustrated is a diagram 1300 of example waveforms of signals that can propagate through the memory circuit shown in FIGS. 11 and/or 12 during memory operations, in accordance with some embodiments. The diagram 1300 shows two read operations, one performed at a first port, and another performed at a second port of an example memory array (e.g., the memory array 1111 of FIG. 11). Similar to the operations shown in FIG. 2, the memory operations are initiated at the rising edge of the input clock signal CLK causing a corresponding rising edge to be generated on the ICLK signal (e.g., by the clock generator circuit 1113) with a slight delay due to the internal logic of the clock generator circuit.

Additionally, as shown, the clock generator circuit 1113 causes the PHASE signal to transition to the logic high state. As either of the PHASE signal and the ICLK signal are both in the logic high state, the PC signal is generated in the logic high state by the TRK pre-charging circuit 1102 (or the TRK pre-charging circuit 1200). The word line signal WL, the tracking word line TRKWL, and the pre-charge signal BLPREB have also transitioned to a logic high state, as described herein, selecting a memory cell of the memory cell array 1111, the TRK memory cell 1110, and deactivating the pre-charge circuits 1124.

As the transistor M51 is turned off and not conducting, and because the transistors M52 and M53 are turned on and conducting, the voltage at the tracking bit line TRKBL begins to decrease (e.g., discharged via the transistors M52 and M53), as described herein. When the tracking bit line TRKBL reaches a threshold voltage of the trigger circuit 1118 (e.g., which may include an inverter or a Schmitt trigger), the reset signal RST transitions to a logic high state (e.g., about the supply voltage). In this example, the threshold voltage is about half of the supply voltage VDD.

As described herein, when the reset signal RST is asserted in the logic high state, the clock generator circuit 1113 causes the ICLK signal to transition to the logic low state, after a suitable amount of delay (which may be implemented via the logic of the clock generator circuit 1113). When the ICLK signal transitions to the logic low state, the word line WL, the tracking word line TRKWL, and the pre-charge signal BLPREB each transition to the logic low state. This causes the pre-charging circuit(s) 1124 to become activated, causing the voltage at the bit line BL to rise, as shown. As shown, the PHASE signal remains in the logic high state, causing the PC signal to remain in the logic high state and the delayed ICLK_RET signal remains in the logic high state, causing the pre-charge signal PC to remain asserted.

While the PC signal is in the logic high state, the transistor M51 remains turned off, keeping the voltage at the TRKBL node in the logic low state, as shown. When the ICLK_RET signal transitions to the logic low state, the PC signal is transitioned to the logic low state, causing the transistor M51 to turn on and conduct. This causes the voltage at the TRKBL node to increase to about the supply voltage, as shown.

When the TRKBL node rises to a threshold voltage of the trigger circuit 1118, the reset signal RST transitions to a logic low state. When the reset signal RST is asserted in the logic low state, the clock generator circuit 1113 causes the ICLK signal to transition to the logic high state, after a suitable amount of delay (which may be implemented via the logic of the clock generator circuit 1113). This initializes a subsequent memory operation during the same clock period as the input clock signal (e.g., on a second memory port of the memory array).

As shown, a similar operation to that described above is performed in response to the assertion of the ICLK signal in the logic high state. When the ICLK signal is transitioned to the logic high state, the clock generator circuit transitions the PHASE signal to the logic low state. As the PHASE signal is in the logic low state, the PC signal is also set to the logic high state matching the timing of the ICLK signal, as shown. During the second memory operation, when the ICLK signal transitions to the logic low state, both transistors M52 and M53 are turned on and conduct, enabling a faster charge time for the tracking bit line TRKBL relative to the first memory operation, as shown.

Figure 14:
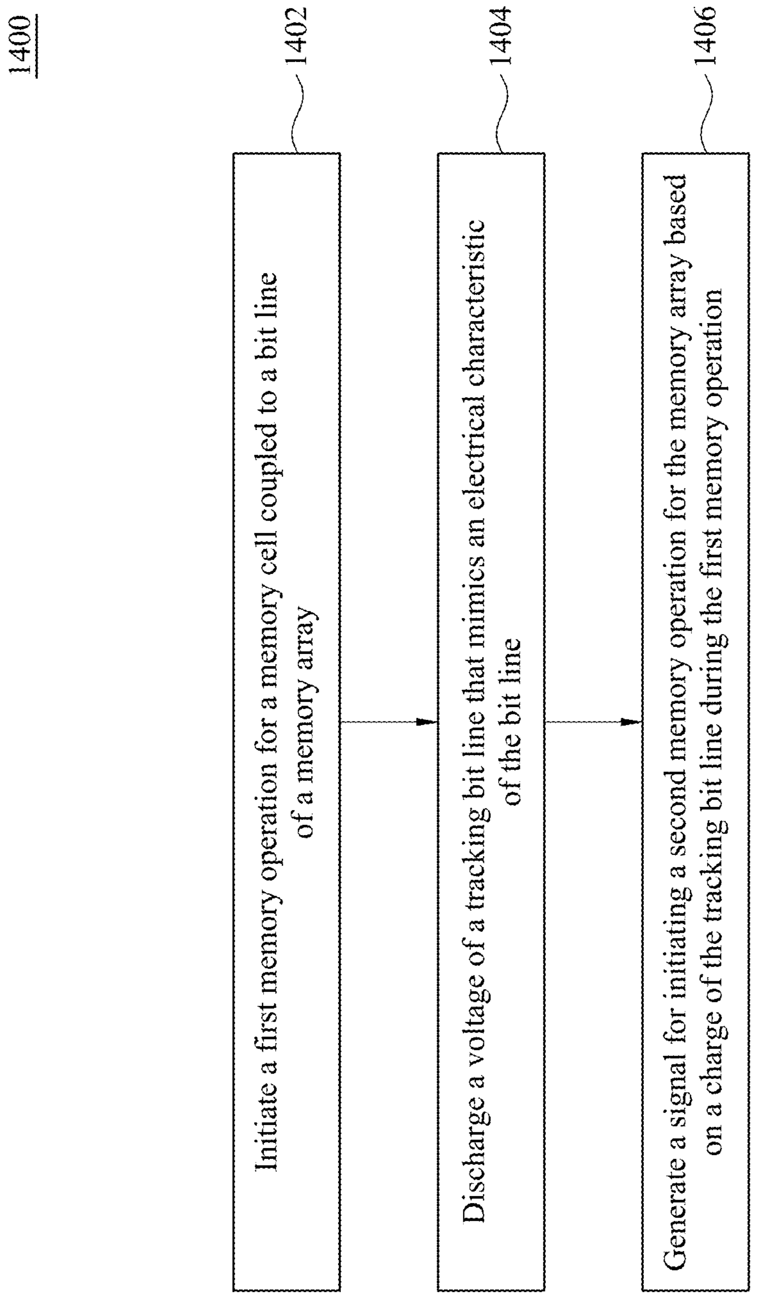
FIG. 14 illustrates a flowchart of example method of operating an example memory circuit that implements delays to create sufficient between margin during memory operations, in accordance with some embodiments.

FIG. 14 illustrates a flowchart of an example method 1400 of operating an example memory circuits that implements delays to reduce contention during memory operations, in accordance with some embodiments. The method 1400 may be used to operate a memory circuit (e.g., the memory circuit 200, 400, 600, 900, or 1100, the memory systems 100, 800, etc.). For example, at least some of the operations described in the method 1400 use layouts and schematics described in FIGS. 1, 2, 4, 6, 8, 9, 11, and 12. It is noted that the method 1400 is merely an example and is not intended to limit the present disclosure. Accordingly, it is understood that additional operations may be provided before, during, and after the method 1400 of FIG. 14, and that some other operations may only be briefly described herein.

In brief overview, the method 1400 starts with operation 1402 of initiating a first memory operation for a memory cell coupled to a bit line of a memory array. The method 1400 proceeds to operation 1404 of discharging a voltage of a tracking bit line that mimics an electrical characteristic of the bit line. The method 1400 proceeds to operation 1406 of generating a signal for initiating a second memory operation for the memory array based on a charge of the tracking bit line during the first memory operation.

Referring to operation 1402, a first memory operation for a memory cell (e.g., the memory cell 108, 808A, 808B) coupled to a bit line (e.g., BL) of a memory array (e.g., the memory array 102, 802A, 802B). For example, a memory controller can provide an input clock signal (e.g., the input clock signal CLK) a memory circuit (e.g., the memory circuit 200, 400, 600, 900, or 1100, the memory systems 100, 800, etc.). In some implementations, a PHASE signal and an ICLK signal can be generated according by a clock generator circuit (e.g., the clock generator circuit 113). The memory operation may be a read operation or a write operation. The memory array can be a pseudo-dual port memory array, in some implementations.

Referring to operation 1404, a voltage of a tracking bit line (e.g., TRKBL, TRKBL_U, TRKBL_D) that mimics an electrical characteristic of the bit line is discharged. Discharging the bit line may performed by activating one or more tracking memory cells (e.g., the TRK memory cells 110, 210, etc.) coupled to the tracking bit line. The number of tracking memory cells coupled to the tracking bit line can match the number of memory cells coupled to the bit line being addressed for the memory operation, in some implementations. Devices used to discharge the TRKBL can be selected such that discharging the TRKBL corresponds to the timing of discharging the bit line, as shown in FIGS. 3, 5, 7, 10, and 13.

Referring to operation 1406, a signal (e.g., the reset signal RST, etc.) for initiating a second memory operation for the memory array is generated based on a charge of the tracking bit line during the first memory operation. The signal can be generated, for example, by a trigger circuit (e.g., the trigger circuit 118, 218, etc.), which may include an inverter or a Schmitt trigger circuit. The trigger circuit can generate the signal upon the voltage of the TRKBL node reaching a transition threshold. The transition threshold can be, in some implementations, about half the supply voltage of the memory circuit, in some implementations. In some implementations, the trigger circuit can generate the signal at a voltage greater than half the supply voltage. The TRKBL node can be charged according by a corresponding TRK pre-charge circuit (e.g., the TRK pre-charging circuit 202, 402, 602, 902, 1102, 1200, etc.). The second memory operation can be a write operation or a read operation, in some implementations.

In one aspect of the present disclosure, a memory system is disclosed. The memory system includes a memory array comprising a bit line. The memory system includes a tracking memory cell array coupled to a tracking bit line that mimics an electrical characteristic of the bit line of the memory array. The memory system includes a tracking pre-charge circuit configured to pre-charge the tracking bit line over a first time period corresponding to a charge time of the bit line in response to a first operation for the memory array. The memory system includes a trigger circuit configured to generate a signal in response to a voltage of the tracking bit line satisfying a threshold, the signal causing a pre-charge circuit to charge the bit line following the first time period.

In another aspect of the present disclosure, a memory circuit is disclosed. The memory circuit includes a tracking bit line coupled to a tracking memory cell. The tracking bit line and the tracking memory cell mimic electrical characteristics of a bit line of a memory array. The memory circuit includes a first transistor coupled to the tracking bit line. The first transistor is configured to electrically couple the tracking bit line to a supply voltage in response to a tracking pre-charge signal. The tracking bit line and the tracking memory cell mimic electrical characteristics of the bit line coupled to the memory cell. The memory circuit includes a clock generator circuit configured to generate an internal clock signal in a logic high state in response to a clock signal for a memory operation, causing generation of the tracking pre-charge signal for a first time period corresponding to a charge time for the bit line of the memory array.

In yet another aspect of the present disclosure, a method is disclosed. The method includes initiating a first memory operation for a memory cell coupled to a bit line of a memory array. The method includes discharging a voltage of a tracking bit line that mimics an electrical characteristic of the bit line over a first time period corresponding to a discharge time of the bit line of the memory array. The method includes generating a signal for initiating a second memory operation for the memory array based on the voltage of the tracking bit line following the first time period.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory system, comprising:

a memory array comprising a bit line;

a tracking memory cell array coupled to a tracking bit line that mimics an electrical characteristic of the bit line of the memory array;

a tracking pre-charge circuit configured to pre-charge the tracking bit line over a first time period corresponding to a charge time of the bit line in response to a first operation for the memory array; and a trigger circuit configured to generate a signal in response to a voltage of the tracking bit line satisfying a threshold, the signal causing a pre-charge circuit to charge the bit line following the first time period;

wherein the tracking pre-charge circuit is further configured to pre-charge the tracking bit line according to a phase signal such that the tracking pre-charge circuit charges the tracking bit line at a first rate responsive to the phase signal being in a logic high state, and charges the tracking bit line at a second rate responsive to the phase signal being in a logic low state.

2. The memory system of claim 1, wherein the memory array comprises at least one memory cell coupled to the bit line.

3. The memory system of claim 2, wherein the tracking bit line is coupled to a number of tracking memory cells corresponding to a number of memory cells coupled to the bit line.

4. The memory system of claim 1, wherein the tracking pre-charge circuit is activated responsive to an internal clock signal generated by a clock generator circuit.

5. The memory system of claim 4, wherein the signal generated by the trigger circuit is provided as a reset signal for the clock generator circuit.

6. The memory system of claim 5, wherein the pre-charge circuit is configured to charge the bit line to a supply voltage in response to a pre-charge signal generated by the clock generator circuit in response to the reset signal.

7. The memory system of claim 1, wherein the trigger circuit comprises one or more of an inverter or a Schmitt trigger circuit.

8. The memory system of claim 1, further comprising a switching circuit configured to generate a switch signal to activate a transistor that couples the tracking bit line to a second tracking bit line, the second tracking bit line comprising a second electrical characteristic that increases a charging time of the tracking bit line.

9. The memory system of claim 1, wherein the first rate is different from the second rate.

10. A memory circuit, comprising:

a tracking bit line coupled to a tracking memory cell, wherein the tracking bit line and the tracking memory cell mimic electrical characteristics of a bit line of a memory array;

a first transistor coupled to the tracking bit line, the first transistor configured to electrically couple the tracking bit line to a supply voltage in response to a tracking pre-charge signal;

a second transistor coupled to the tracking bit line, the second transistor configured to selectively electrically couple the tracking bit line to the supply voltage in response to the tracking pre-charge signal and according to a phase signal such that the tracking bit line is charged at a first rate responsive to the phase signal being in a logic high state and at a second rate responsive to the phase signal being in a logic low state; and a clock generator circuit configured to generate an internal clock signal in a logic high state in response to a clock signal for a memory operation, causing generation of the tracking pre-charge signal for a first time period corresponding to a charge time for the bit line of the memory array.

11. The memory circuit of claim 10, wherein the internal clock signal is provided as the tracking pre-charge signal to a gate terminal to the first transistor.

12. The memory circuit of claim 10, wherein the first transistor charges the tracking bit line at a rate that corresponds to a charging time of the bit line of the memory array.

13. The memory circuit of claim 10, wherein the second transistor is coupled in parallel with the first transistor.

14. The memory circuit of claim 10, further comprising a delay path matching an electrical characteristic of a signal path for a pre-charge circuit coupled to the bit line, wherein the tracking pre-charge signal is generated further based on a signal propagated via the delay path.

15. The memory circuit of claim 14, wherein the delay path comprises at least one buffer circuit.

16. The memory circuit of claim 14, further comprising a buffer circuit configured to generate a pre-charge signal for the pre-charge circuit based on the internal clock signal.

17. The memory circuit of claim 10, further comprising an inverter configured to receive a voltage from the tracking bit line and generate a reset signal for the clock generator circuit responsive to the voltage satisfying a threshold.

18. The memory circuit of claim 10, wherein the first rate is different from the second rate.

19. A method, comprising:

initiating a first memory operation for a memory cell coupled to a bit line of a memory array;

discharging a voltage of a tracking bit line that mimics an electrical characteristic of the bit line over a first time period corresponding to a discharge time of the bit line of the memory array;

pre-charging the tracking bit line according to a phase signal such that the tracking bit line is charged at a first rate responsive to the phase signal being in a logic high state and at a second rate responsive to the phase signal being in a logic low state; and generating a signal for initiating a second memory operation for the memory array based on the voltage of the tracking bit line following the first time period.

20. The method of claim 19, wherein generating the signal for initiating the second memory operation is responsive to the voltage of the tracking bit line satisfying a threshold.

* * * * *